United States Patent
Kuge

(12) 
(10) Patent No.: US 6,339,553 B1
(45) Date of Patent: Jan. 15, 2002

(54) CLOCK GENERATING CIRCUIT HAVING ADDITIONAL DELAY LINE OUTSIDE DIGITAL DLL LOOP AND SEMICONDUCTOR MEMORY DEVICE INCLUDING THE SAME

(75) Inventor: Shigehiro Kuge, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/655,823

(22) Filed: Sep. 6, 2000

(30) Foreign Application Priority Data

Sep. 8, 1999 (JP) .......................................... 11-254438

(51) Int. Cl.[7] ................................................ G11C 7/00
(52) U.S. Cl. ........................ 365/194; 365/233; 327/291; 327/298
(58) Field of Search ................................ 365/233, 194, 365/236, 189.01, 230.01; 327/291, 298, 277

(56) References Cited

U.S. PATENT DOCUMENTS 5,844,438 A * 12/1998 Lee ............................. 327/291
5,990,730 A * 11/1999 Shinozaki .................... 327/544
6,104,225 A * 8/2000 Taguchi et al. .............. 327/298
6,166,990 A * 12/2000 Ooishi et al. ................ 365/233
6,212,126 B1 * 4/2001 Sakamoto .................... 365/233

FOREIGN PATENT DOCUMENTS

| JP | 8-321773 | 12/1996 |
| JP | 9-63267 | 3/1997 |
| JP | 10-171774 | 6/1998 |

* cited by examiner

Primary Examiner—Hoai V. Ho
(74) Attorney, Agent, or Firm—McDermott, Will & Emery

(57) ABSTRACT

A DLL circuit includes two clock input buffers generating mutually complementary internal signals synchronized with an external clock signal a first delay circuit forming a delay loop arranged between one of the clock input buffers and a phase difference control circuit, a phase difference control circuit setting a delay control time so that a signal which has passed through the delay loop and one of the internal signals have matching phases, a second delay circuit applying the delay control time set commonly to the first delay circuit to the other one of the internal signal, and a pulse generating circuit generating an internal clock signal in response to output signals of the first and second delay circuits.

20 Claims, 24 Drawing Sheets

FIG. 7

| ADR<0:M-1> COUNT VALUE | R<n> | ... | R<4> | R<3> | R<2> | R<1> | R<0> |
|---|---|---|---|---|---|---|---|
| | | HIGHER BITS | | | LOWER BITS | | |
| 0 | 0 | 0 | 0 | 0 | 0 | 0 | 0 |
| 1 | 0 | 0 | 0 | 0 | 0 | 0 | 1 |
| 2 | 0 | 0 | 0 | 0 | 0 | 1 | 0 |
| 3 | 0 | 0 | 0 | 0 | 0 | 1 | 1 |
| ... | | | | ⋮ | | | |
| 7 | 0 | 0 | 0 | 0 | 1 | 1 | 1 |
| 8 | 0 | 0 | 0 | 1 | 0 | 0 | 0 |
| 9 | 0 | 0 | 0 | 1 | 0 | 0 | 1 |
| ... | | | | ⋮ | | | |
| 15 | 0 | 0 | 0 | 1 | 1 | 1 | 1 |
| 16 | 0 | 0 | 1 | 0 | 0 | 0 | 0 |
| ... | | | | ⋮ | | | |
| $2^M-1$ | 1 | 0 | 0 | 0 | 1 | 1 | 1 |

$2^{(M-3)}$ BITS

DECIMAL REPRESENTATION

//www.w3.org/2000/svg"
CLOCK GENERATING CIRCUIT HAVING ADDITIONAL DELAY LINE OUTSIDE DIGITAL DLL LOOP AND SEMICONDUCTOR MEMORY DEVICE INCLUDING THE SAME

BACKGROUND OF THE INVENTION

1. Field of the Invention

The present invention relates to a clock generating circuit used for a semiconductor memory device. More specifically, the present invention relates to a clock generating circuit generating, by a digital DLL (Delay Locked Loop), an internal clock synchronous with an externally applied reference clock, and to a semiconductor memory device provided with the clock generating circuit.

2. Description of the Background Art

For generating a clock signal in a semiconductor memory device, a technique has been known in which a clock generating circuit employing a digital DLL (Delay Lock Looped) (hereinafter also simply referred to as a DLL circuit) is used to delay phase of an externally applied reference clock signal to generate an internal clock signal synchronized with the external clock. This technique is of particular importance in a synchronous semiconductor memory device (SDRAM: Synchronous Dynamic Random Access Memory). Recently, a DDR-SDRAM (Double Data Rate SDRAM) capable of outputting data at the timings of both rising and falling edges of the external clock signal to attain higher speed of operation has been developed.

FIG. 31 is a timing chart representing operation timings of the DDR-SDRAM.

Referring to FIG. 31, reference character ext.CLK represents an external reference clock signal which repeatedly rises and falls at the period of Tc. In the DDR-SDRAM, data DQ is output both at the rising edge and the falling edge of ext.CLK. In order to output data at timings synchronized with ext.CLK, it is necessary to generate in the semiconductor memory device an internal clock pulse int.CLKP as a trigger, at a timing earlier by a data output delay time To consumed by a data output buffer than the timing of rising and falling edges of ext.CLK.

Further, in the DDR-SDRAM, generally, "SSTL2" is used as an interface standard for the clock input signal generally. FIG. 32 is a timing chart representing SSTL2 standard.

In STTL2, external clock signal ext.CLK and an inverted signal /ext.CLK thereof as complementary signals are used to define a rising edge of the clock at a timing when signal levels satisfy the condition of ext.CLK>/ext.CLK and conversely, the falling edge at the timing when /ext.CLK>ext.CLK.

As the data DQ is output in response to the rising and falling edges, the two output periods of data output corresponding to one period of the external clock signal are represented as a period tCH from a rising edge to the falling edge of the clock and a time period tCL from the falling edge to the rising edge. In the DDR-SDRAM, the ratio between tCH and tCL should desirably be 50:50, and SSTL2 standard requires that the ratio is within the range of 55:45 to 45:55.

FIG. 33 is a block diagram representing a configuration of a conventional DDL circuit 1000 used in a synchronous semiconductor memory device.

Referring to FIG. 33, DLL circuit 1000 includes: a clock input buffer 1010 receiving external clock signal ext.CLK and reference voltage Vref and outputting a clock signal BufCLK; a delay circuit 120 receiving clock signal BufCLK, adding a delay time in accordance with a count data ADR<0:M−1> and outputting the result; a level shifter 130 for changing voltage level of an output signal from delay circuit 120; a delay replica circuit 140 adding a prescribed delay time to the output of level shifter 130 and outputting a feedback clock signal FBCLK; and a phase difference control circuit 150 controlling phase difference between feedback clock signal FBCLK and clock signal BufCLK.

FIG. 34 is a circuit diagram representing a configuration of a clock input buffer 1010.

Referring to FIG. 34, clock input buffer 1010 has P type MOS transistors QPa and QPb as well as N type MOS transistors QNa and QNb constituting a current mirror amplifier comparing input voltage levels at input nodes Ni1 and Ni2, amplifying difference between the voltage levels and outputting the difference to node Nb, and an inverter IVa outputting a signal in accordance with the voltage level at node Nb to node No. The clock signal BufCLK is output to node No.

Again referring to FIG. 33, phase difference control circuit 150 includes: a phase comparing circuit 152 comparing phases of clock signal BufCLK and feedback clock signal FBCLK and outputting count designating signals DWN, UP and LCK and a count clock signal cntclk in accordance with the result of comparison; and an up/down count circuit 154 setting the delay control amount count data ADR<0:M−1> in accordance with the count designating signals.

Up/down count circuit 154 updates count data ADR<0:M−1> in order to increase/decrease the delay control amount so that clock signals ext.CLK and FBCLK are synchronized, in accordance with the signal levels of count designating signals DWN, UP and LCK. Count data ADR<0:M−1> is a signal of M (M: natural number) bits representing the counted delay control amount.

In a locked state, feedback clock signal FBCLK is delayed by exactly one period (Tc) from clock signal BufCLK. At this time, feedback clock signal FBCLK has its phase delayed by Tc+Ti (Ti: delay time generated in clock input buffer) from the external clock signal ext.CLK. Similarly, clock signal int.CLKD has its phase delayed by Tc−To (To: delay time generated in output buffer) from the external clock signal.

The clock int.CLKD output from level shifter 130 is transmitted to pulse generating circuit 1060. Pulse generating circuit 1060 outputs internal clock pulse int.CLKP in response to the rising and falling edges of clock signal ext.CLKD.

FIG. 35 is a circuit diagram representing configuration of pulse generating circuit 1060.

Referring to FIG. 35, pulse generating circuit 1060 includes: a one shot pulse generating circuit 1062 generating a one shot pulse in response to a rising edge of clock signal int.CLKD; and a one shot pulse generating circuit 1064 generating a one shot pulse in response to a falling edge of clock Referring to FIG. 37, delay unit 200-m has clocked inverters CIVa and CIVb operating in response to a control signal R<m> from decode circuit 210-m. Clocked inverter CIVa operates when the control signal R<m> is activated (H level), inverts the clock signal BufCLK and outputs the result. Clocked inverter CIVb operates when control signal R<m> is inactive (L level), inverts an output of the delay unit of the preceding stage and outputs the result.

Delay unit 200-m further includes an inverter IVc. Inverter IVc has an input node connected to output nodes of clocked inverters CIVa and CIVb. An output of inverter IVc is applied to an input node of clocked inverter CIVb in the delay unit 200-(m+1) of the succeeding stage.

Because of this configuration, when the corresponding control signal R<m> is active, delay unit 200-m delays clock signal BufCLK and transmits it to the delay unit of the succeeding unit, and when the control signal R<m> is inactive, the delay unit further delays the delay unit input/output signal of the preceding stage and transmits the result to the delay unit of the succeeding stage. The signal output from IVc of delay unit 200-0 is transmitted to a level shifter 130. An input node of CIVb of delay unit 200-n is coupled to the ground voltage.

In the conventional DLL circuit 1000, however, single delay line causes a problem that the interval of generation of the internal clock pulse int.CLKP is not uniform because of variations of characteristics of the transistors constituting the delay unit.

FIG. 38 is a timing chart representing the problem of the DLL circuit 1000 in accordance with the prior art.

Referring to FIG. 38, in response to the rising edge of external clock signal ext.CLK, clock signal BufCLK rises after the lapse of Ti. A delay time corresponding to the count data ADR<0:M−1> is added by delay circuit 120 to clock signal BufCLK.

The signal BufCLKdly represents waveform of that clock signal BufCLK to which the delay time has been added by one delay unit. The delay time added at the rising edge to the clock signal BufCLKdly is represented by T1, and the delay time added at the falling edge is signal int.CLKD. One shot pulse generating circuit 1062 has an odd-number of inverters 1063 for inverting and delaying clock signal int.CLKD, and a logic gate LGa receiving as two inputs the clock signal int.CLKD and an output of inverter group 1063 and outputting a result of AND operation. One shot pulse generating circuit 1064 includes, in addition to the configuration of one shot pulse generating circuit 1062, an inverter IVb for inverting the clock signal int.CLKD.

Pulse generating circuit 1060 further includes a logic operation gate LGc receiving as two inputs the outputs from one shot pulse generating circuits 1062 and 1064 and outputting the result of an OR operation. Logic gate LGc outputs internal clock pulse int.CLKP. Because of this configuration, the internal clock pulse int.CLKP is activated (raised to the H level) in the form of one shot pulse, both at the rising and falling edges of clock signal int.CLKD.

Again referring to FIG. 33, internal clock pulse int.CLKP is transmitted to output buffer 60 and used as an output trigger for the data signal. Considering the delay time To in the output buffer, it is possible to output data at a timing delayed in phase by Tc from external clock signal ext.CLK, that is, the timing synchronized with the external clock signal, by utilizing the internal clock pulse int.CLKP generated based on the clock signal of the locked state.

FIG. 36 is a block diagram representing a configuration of delay circuit 120.

Referring to FIG. 36, delay circuit 120 has $2^M$ delay units 200-0 to 200-n (n=$2^M$−1) connected in series with each other. Decode circuits 210-0 to 210-n are provided correspondingly to delay units 200-0 to 200-n, respectively. Decode circuits 210-0 to 210-n output control signals R<0> to R<n> designating activation of the corresponding delay unit, in response to count data ADR<0:M−1>.

FIG. 37 is a circuit diagram representing configuration of the delay unit.

FIG. 37 shows a configuration of mth (m: natural number from 1 to n−1) delay unit 200-m. represented as T2.

The rising and falling times of the signal at the clocked inverter will be represented as Tr (CIV) and Tf (CIV), and the rising and falling times of the signal in the inverter will be represented as Tr (V) and Tf (IV). The delay time T1 is represented as a sum of Tf (CIV) and Tr (IV), and delay time T2 is represented as a sum of Tr (CIV) and Tf (IV).

Generally, the ratio of current drivabilities of N and P MOS transistors constituting the inverter and the clocked inverter is not constant because of variations in manufacturing. Further, difference in fan out capability ratio and the like between the inverter and the clocked inverter may result in different rise and fall times in the inverter and the clocked inverter.

From these reasons, generally, the time periods T1 and T2 are not equal to each other. FIG. 38 shows an example in which T1>T2.

In a locked state, clock signal int.CLKD comes to a rising edge at a timing earlier by To from the rising edge of the next external clock signal. At this time, assuming that the delay control amount represented by count data ADR<0:M−1> is α, the phase difference of int.CLKD from BufCLK with respect to the rising edge is α·T1. The phase difference of int.CLKD from BufCLK with respect to the falling edge is α·T2.

From the reasons described above, when the delay times T1 and T2 in the delay unit differ, the ratio between the H level period and the L level period of clock signal int.CLKD comes to be much different from 50:50. One shot pulses are generated as clock pulse int.CLKP in response to the rising and falling edges of clock signal int.CLKD.

When pulses as internal clock pulse int.CLKP that are generated in response to the rising edges of the external clock signal are considered, these pulses are generated while maintaining the period Tc of the external clock signal. Therefore, in the internal clock pulse int.CLKP output from DLL circuit 1000 in accordance with the prior art, the ratio between tCH and tCL described with reference to FIG. 32 is not kept uniform. Therefore, when data output takes place in the DDR-SDRAM by using such clock pulses, SSTL2 standard cannot be satisfied, and synchronized data output cannot trigger signal of a data output operation in the output buffer circuit.

The clock generating circuit includes an input buffer circuit generating an internal signal in response to an external clock signal, a delay circuit adding a delay control time to the internal signal, a delay replica circuit adding an input/output delay time generated by the output buffer circuit and the input buffer circuit to an output signal from the delay circuit, a program circuit for setting, in non-volatile manner, the input/output delay time by an external electrical input, a phase difference control circuit setting the delay control time in accordance with the phase difference between the internal signal and an output signal of the delay replica circuit, and a signal generating circuit generating the internal clock signal in response to the output signal from the delay circuit.

According to a still further aspect, the present invention provides a clock generating circuit generating an internal clock signal in synchronization with an external clock signal, including a delay circuit, an input buffer, a phase difference control circuit and a signal generating circuit.

The input buffer generates an internal signal in response to a clock signal external to the circuit. The delay circuit adds a delay control time to the internal signal.

The delay circuit includes a plurality of delay unit circuits connected in series. The delay unit includes a plurality of inverters connected in series. At least one of the inverters includes a first MOS transistor and a first resistance element coupled in series between a first voltage and an output node, and a second MOS transistor and a second resistance element coupled in series between a second voltage and the output node, and the first and second MOS transistors have their gates connected to an input node of the corresponding inverter.

The phase difference control circuit sets the delay control time by setting the number of the plurality of delay unit circuits to be activated, in accordance with the phase difference between the internal signal and an output signal of the delay circuit.

Therefore, an advantage of the present invention is that because of semiconductor memory device operating in synchronization with an external clock signal, including a memory cell array, a control circuit, an output buffer circuit and a clock generating circuit.

The memory cell array has a plurality of memory cells arranged in a matrix of rows and columns. The control circuit controls data access operation to the memory cell. The output buffer circuit outputs read data from the memory cell. The clock generating circuit generates an internal clock signal synchronized with the external clock signal, which will be a trigger signal of a data output operation in the output buffer circuit.

The clock generating circuit includes an input buffer circuit generating an internal signal in response to the external clock signal, a delay circuit adding a delay control time to the internal signal, a phase difference control circuit setting the delay control time in accordance with phase difference between the internal signal and an output signal from the delay circuit, and a signal generating circuit generating the internal clock signal in response to an output signal of the delay circuit. The phase difference control circuit includes a phase difference comparing circuit comparing phase difference between the internal signal and the output signal of the delay circuit, a phase difference count circuit operating in response to an output of the phase difference comparing circuit and changing setting of the delay control time, and a count stopping circuit instructed by the control circuit and stopping operation of the phase difference count circuit in a period when read data is being output from the semiconductor memory device.

According to a still further aspect, the present invention provides a semiconductor memory device operating in synchronization with an external clock signal, including a memory cell array, a control circuit, an output buffer circuit and a clock generating circuit.

The memory cell array has a plurality of memory cells arranged in a matrix of rows and columns. The control circuit controls data access operation to the memory cell. The output buffer circuit outputs read data from the memory cell. The clock generating circuit generates an internal clock signal synchronized with the external clock signal, which will be a be executed at one of the activating edges of the external clock signal.

For example, in the conventional DLL circuit 1000, a delay loop synchronized with the rising edge of the external clock signal is provided, and therefore it is possible to generate clock pulses synchronized with the external clock signal at the rising edges. As to the falling edges, however, it is difficult to obtain clock pulses synchronized with the external clock signal, because of the influence of difference in transmission characteristics between the rising and falling edges in the delay unit.

SUMMARY OF THE INVENTION

An object of the present invention is to provide a configuration of a clock generating circuit generating an internal clock synchronous with an externally applied reference clock by means of a digital DLL (Delay Locked Loop) suitable as a clock generating circuit of a semiconductor memory device represented by a DDR-SDRAM, as well as to provide a semiconductor memory device including such a clock generating circuit.

In summary, the present invention provides a clock generating circuit generating an internal clock signal synchronized with an external clock signal, including a first input buffer circuit, a first delay circuit, a phase difference control circuit, a second input buffer circuit, and a second delay circuit signal generating circuit.

The first input buffer circuit generates a first internal signal in response to the external clock signal. The first delay circuit adds a delay control time to the first internal signal. Phase difference control circuit sets the delay control time in accordance with the phase difference between the first internal signal and an output signal of the first delay circuit. The second input buffer circuit generates a second internal signal having its phase inverted from that of the first internal signal, in response to the external clock signal. The second delay circuit adds the delay control time set commonly with the first delay circuit circuit to the second internal signal, under control of the phase difference control circuit. The signal generating circuit generates an internal clock signal in response to output signals of the first and second delay circuits.

According to another aspect, the present invention provides a the delay circuit capable of adding the delay control time common to the inside and the outside of the delay feedback loop input to the phase control circuit, it is possible to obtain an internal clock signal synchronized with both the rising edge and the falling edge of the external clock signal, while maintaining the duty ratio of the external clock signal.

Further, as a clock generating circuit having a DLL loop maintaining the delay control time at a constant value during a period when the read data is being output is provided, the data reading operation of the semiconductor memory device can be executed with higher stability.

Further, as a clock generating circuit having a DLL loop of which input/output delay time can be adjusted and set by external program even after chip molding is provided, a semiconductor memory device can be provided which operates based on the internal clock signal which is more exactly synchronized with the external clock signal.

Further, as temperature dependency of the delay time added by each delay unit is reduced, a clock generating circuit can be provided which can accommodate an external clock signal having low frequency when the temperature is low, by a delay circuit having smaller layout area.

The foregoing and other objects, features, aspects and advantages of the present invention will become more apparent from the following detailed description of the present invention when taken in conjunction with the accompanying drawings.

Figure 2:
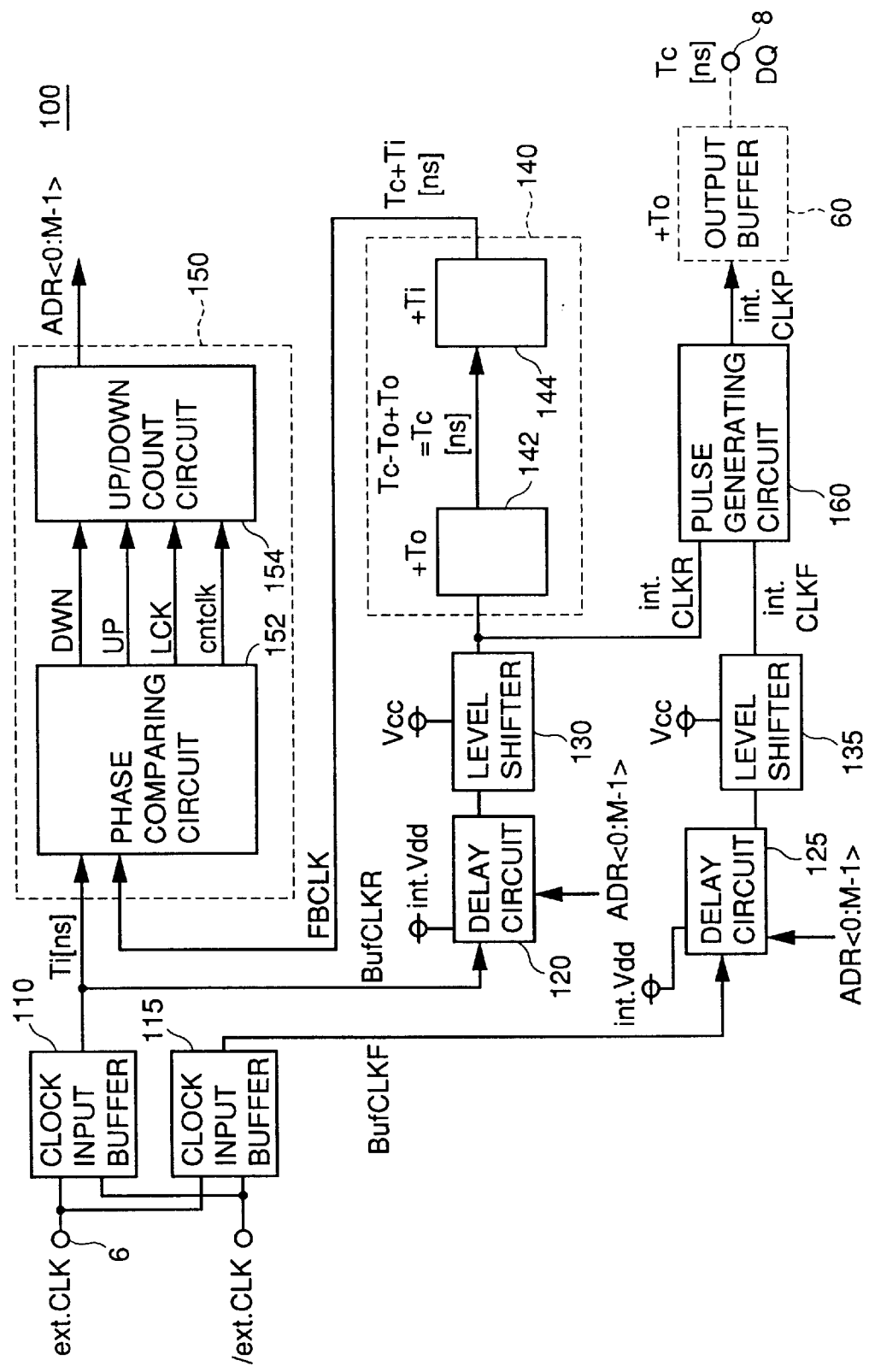

FIG. 2 is a block diagram representing a configuration of a DLL circuit 100 in accordance with the first embodiment of the present invention.

Figure 3:
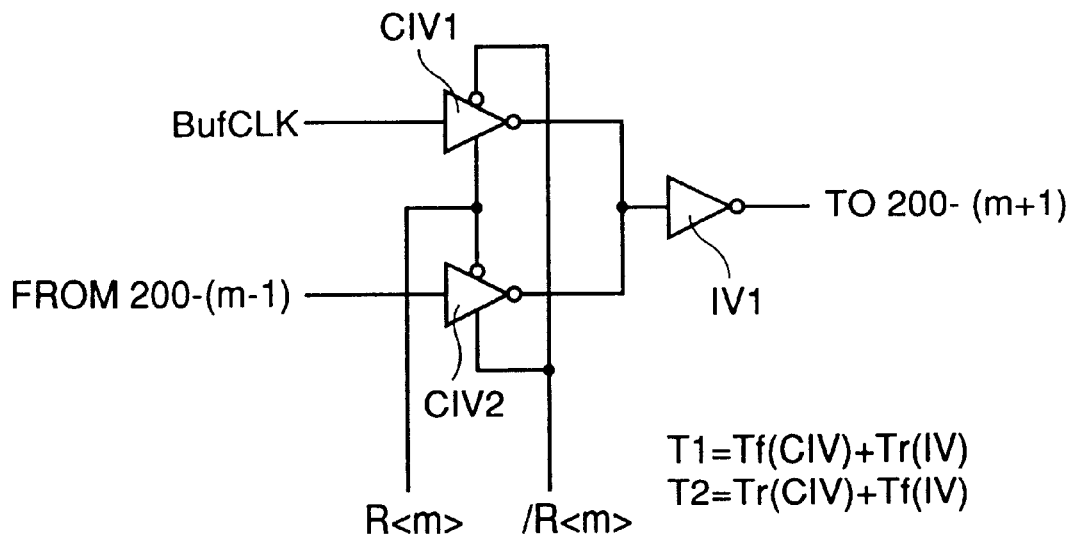

FIG. 3 is a circuit diagram representing a configuration of a delay unit 200.

Figure 4:
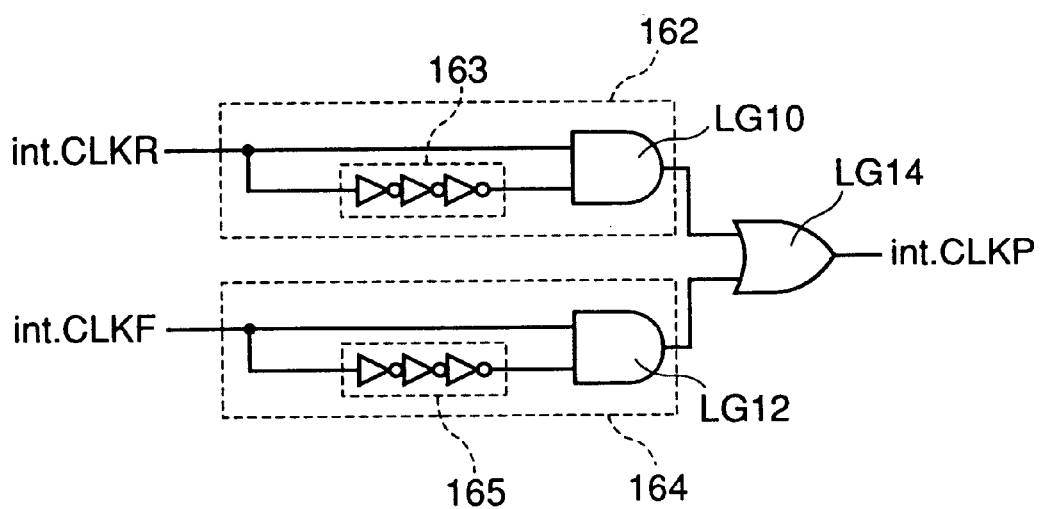

FIG. 4 is a circuit diagram representing a configuration of a pulse generating circuit 160.

Figure 5:
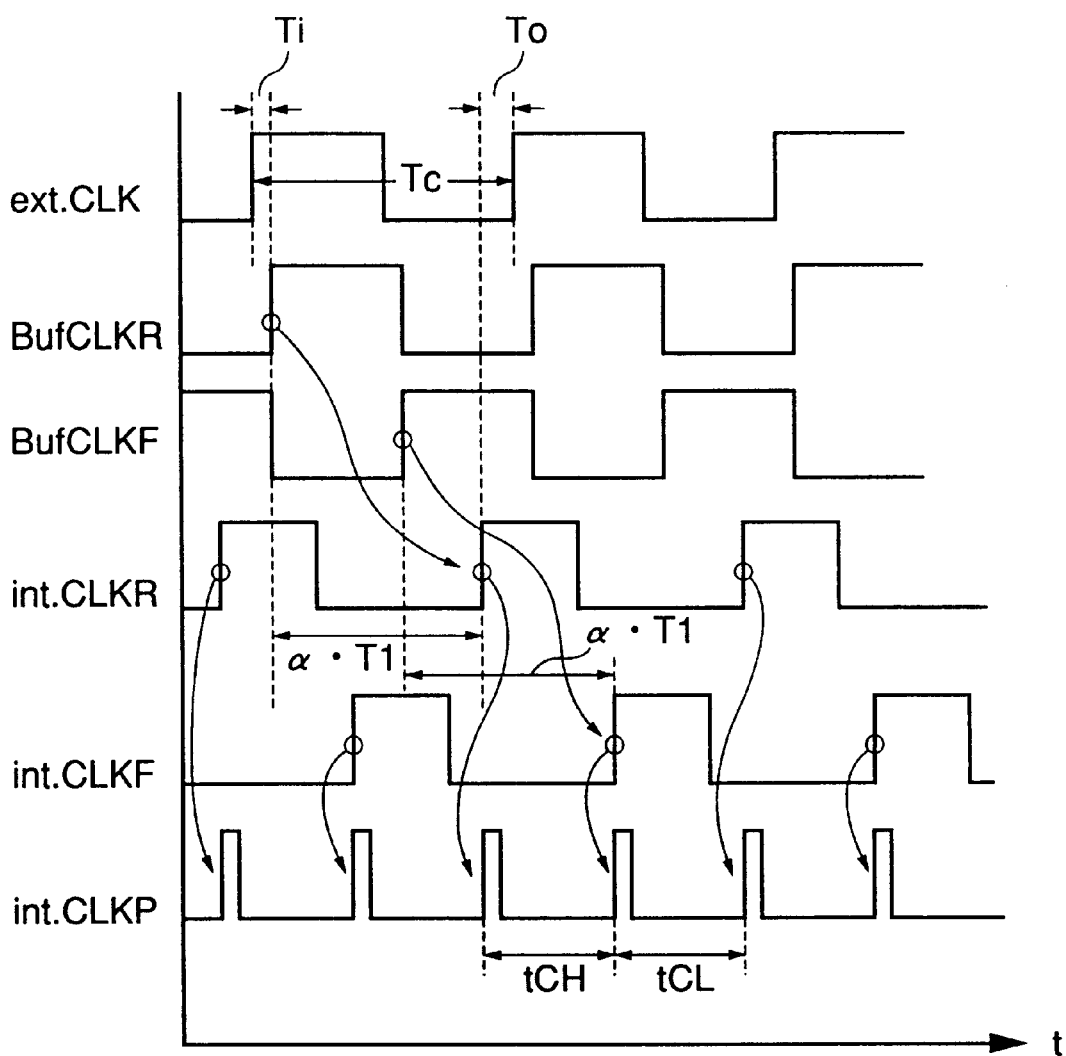

FIG. 5 is a timing chart related to an operation of DLL circuit 100 in accordance with the first embodiment.

Figure 6:
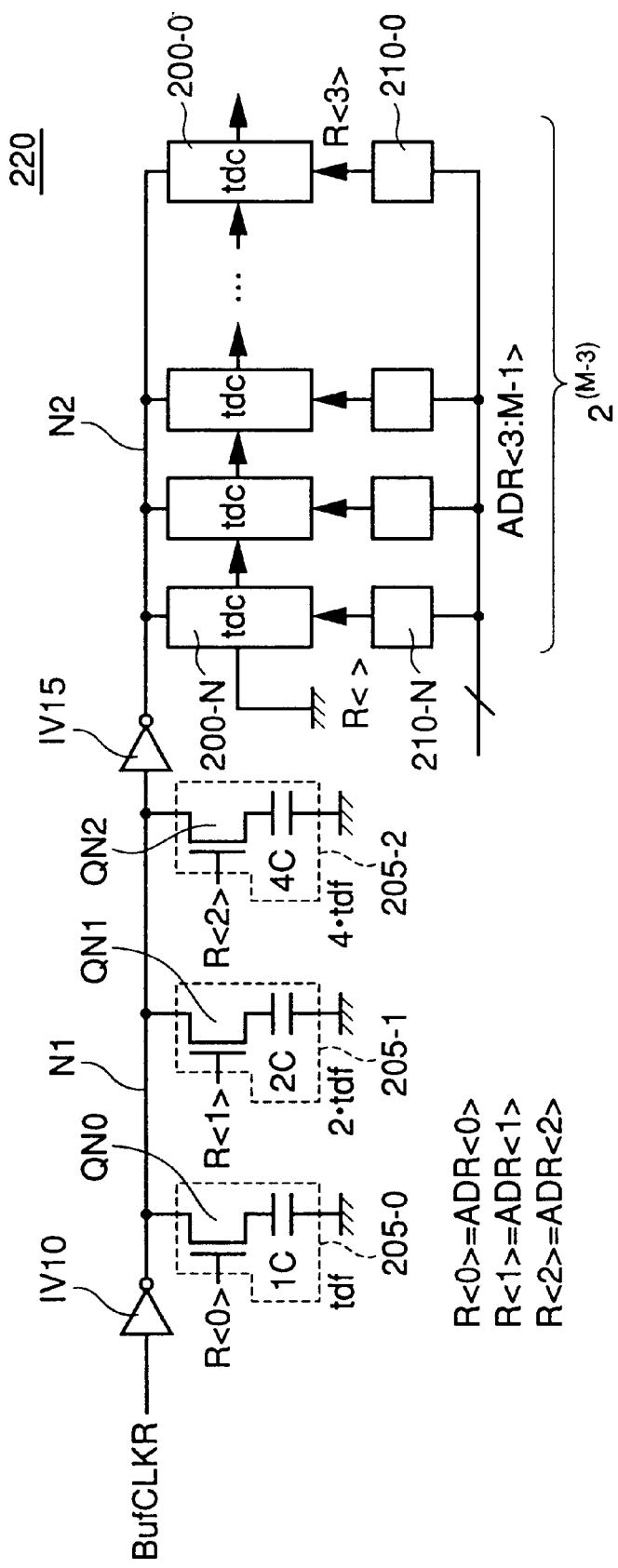

FIG. 6 is a block diagram representing a configuration of a delay circuit 220 in accordance with a second embodiment.

FIG. 7 represents correspondence between count data and control signals in the delay circuit 220.

Figure 8:
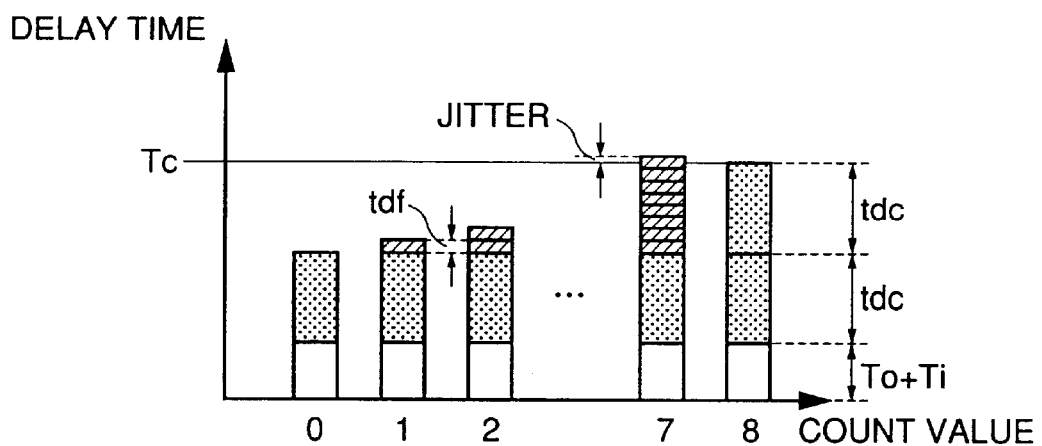

FIG. 8 is a schematic illustration showing relation between count value in the DLL circuit and delay time added in the delay loop, in accordance with the second embodiment.

Figure 9:
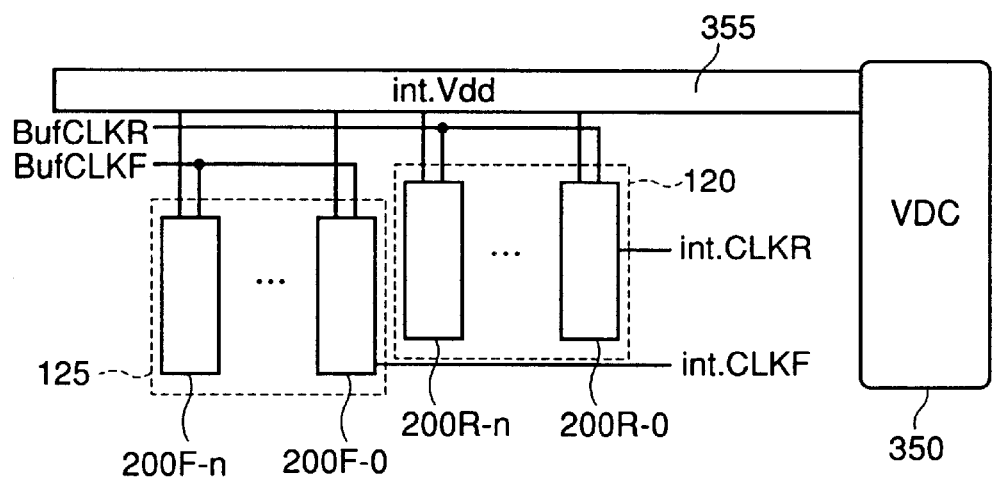

FIG. 9 is a block diagram representing an example of an arrangement of a delay circuit 120 and a delay circuit 125.

Figure 10:
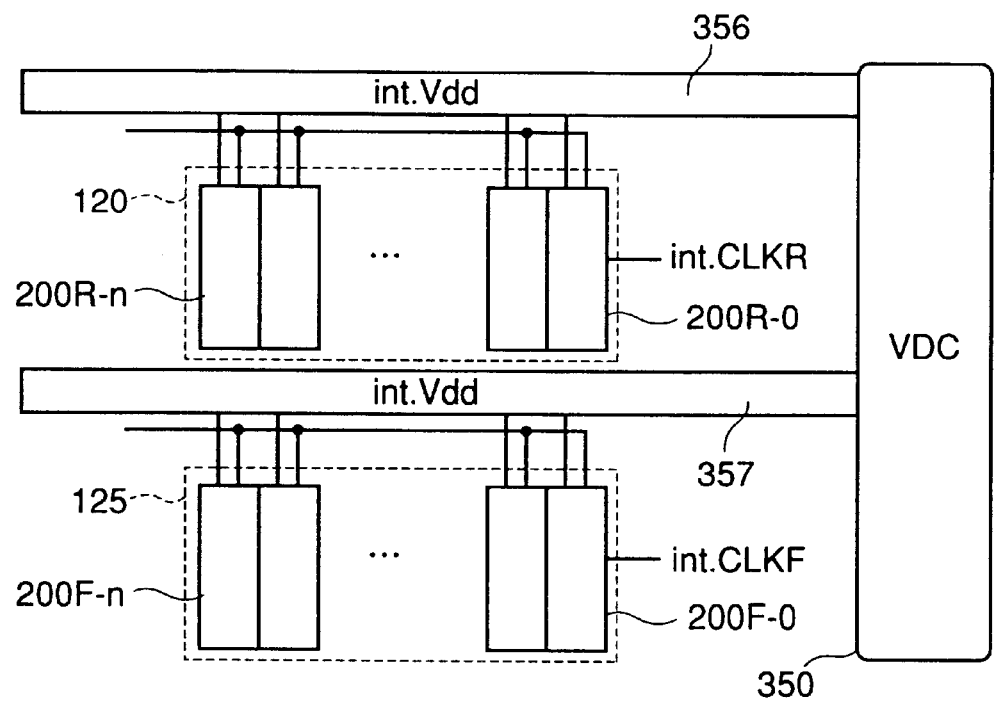

FIG. 10 is a block diagram representing a configuration of a delay unit in the delay circuit in accordance with a third embodiment.

Figure 11:
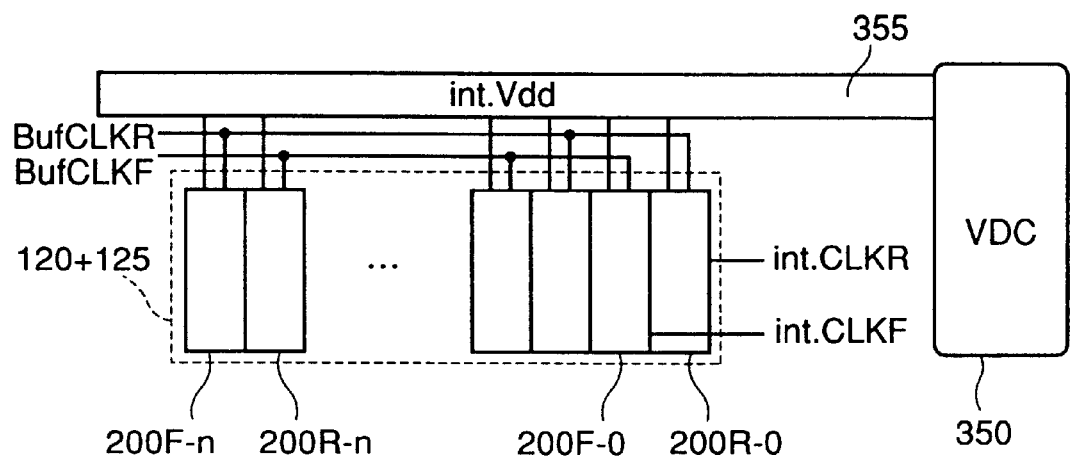

FIG. 11 is a block diagram representing a configuration of the delay unit of the delay circuit in accordance with a modification of the third embodiment.

Figure 12:
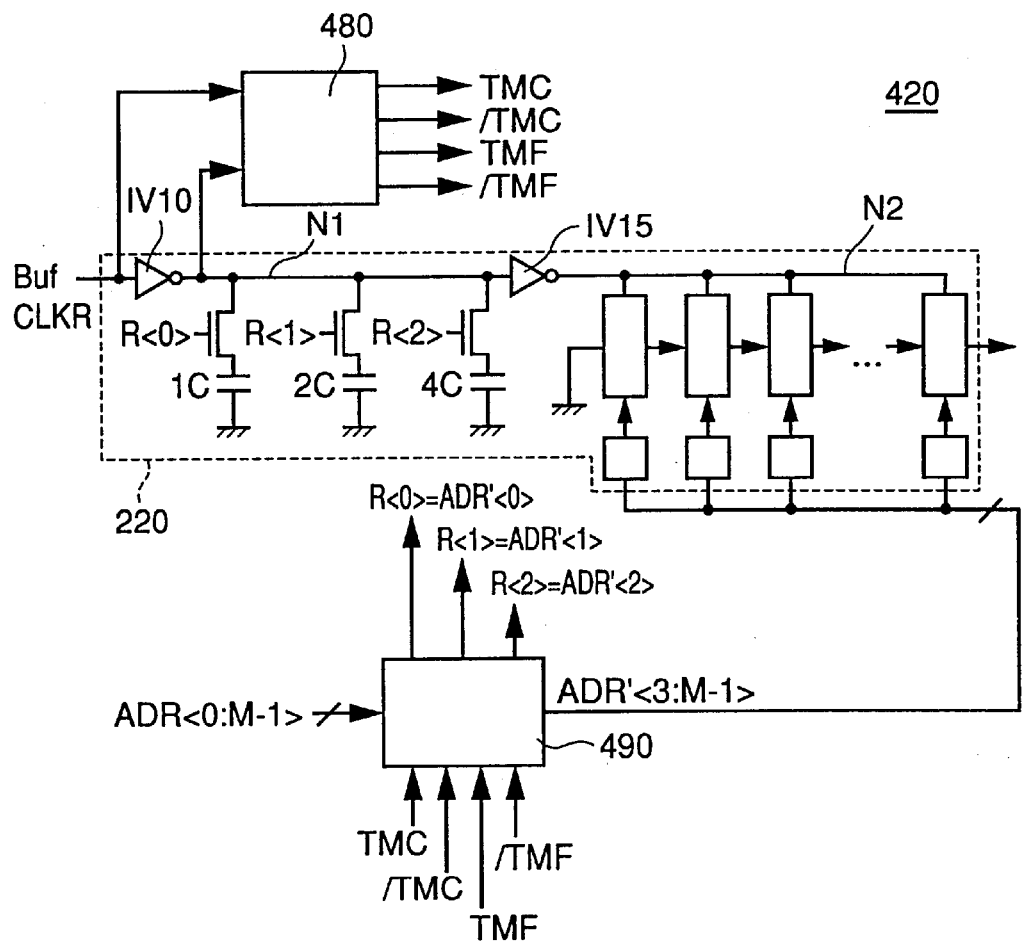

FIG. 12 is a block diagram representing a configuration of a delay circuit 420 in accordance with a fourth embodiment.

Figure 13:
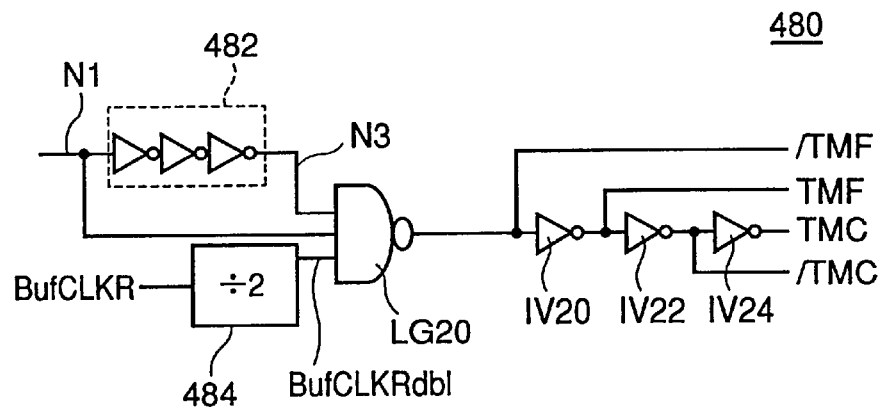

FIG. 13 is a circuit diagram representing a configuration of a switch timing control circuit 480.

Figure 14:
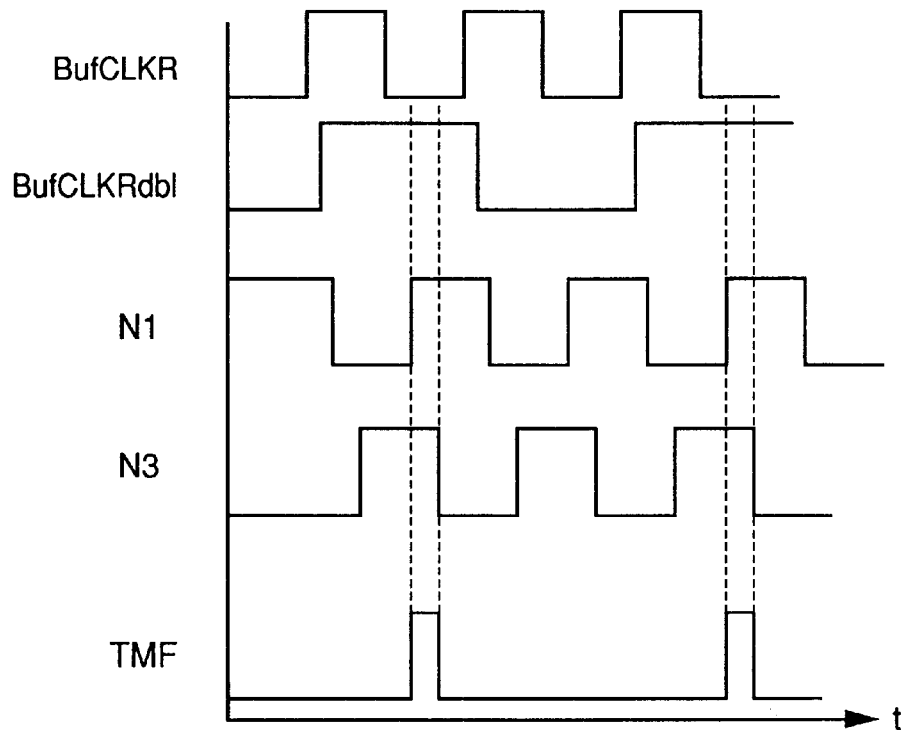

FIG. 14 is a timing chart representing an operation of switch timing control circuit 480.

Figure 15:
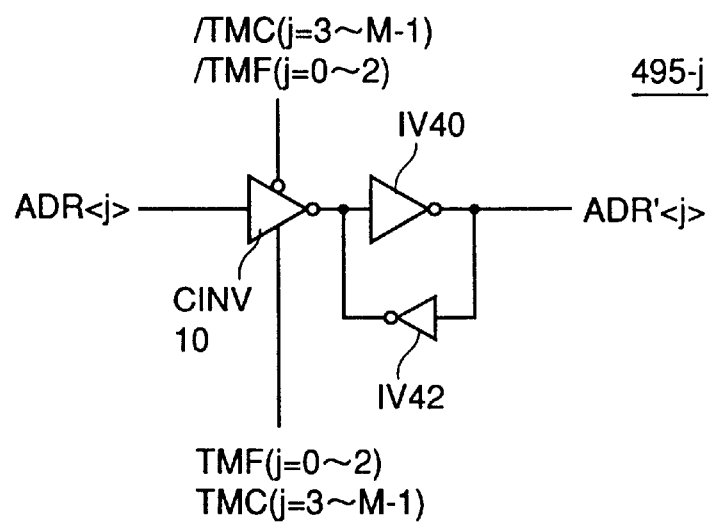

FIG. 15 is a circuit diagram representing a configuration of a count data transmitting unit.

Figure 16:
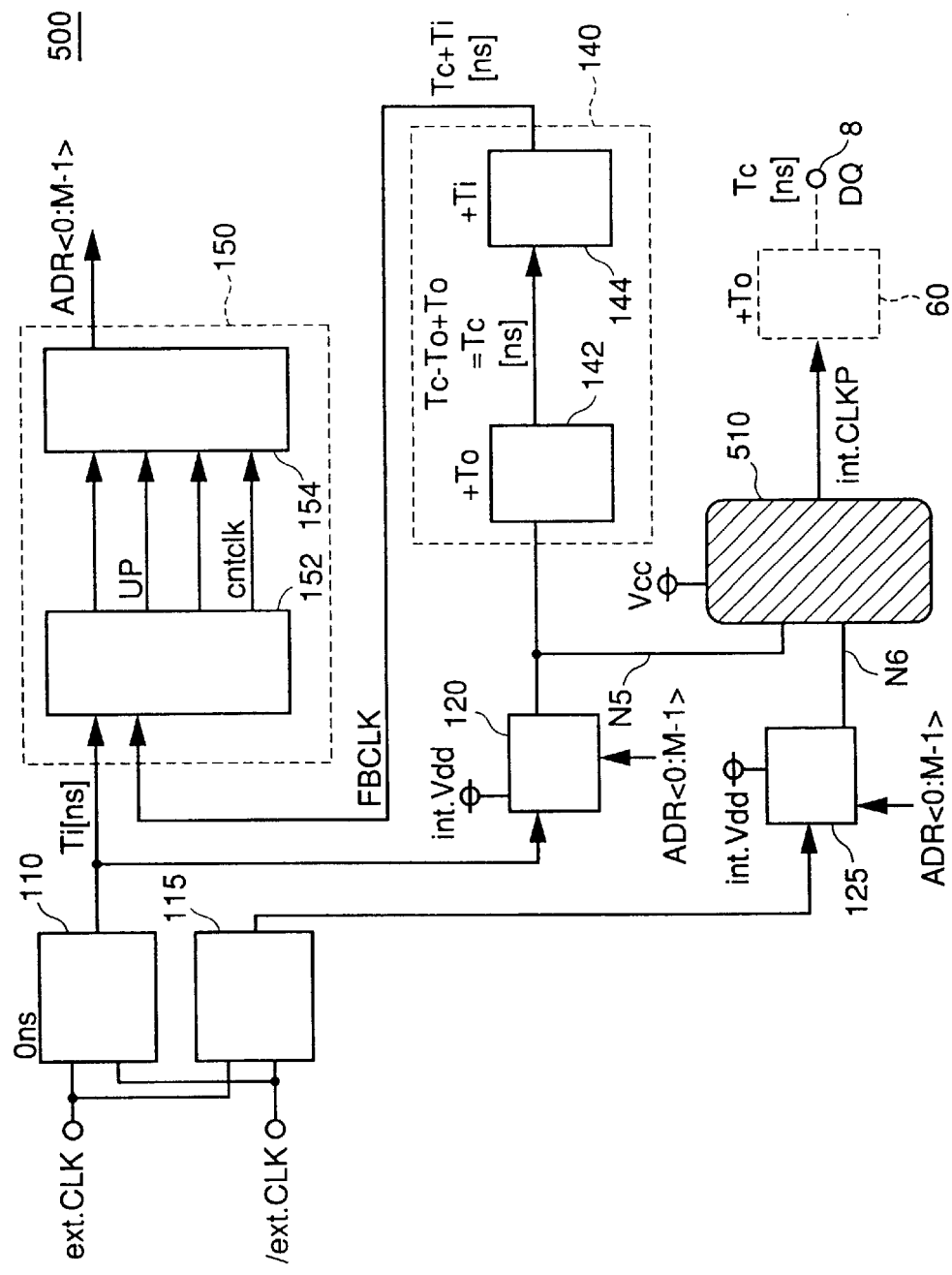

FIG. 16 is a block diagram representing a configuration of a DLL circuit 500 in accordance with a fifth embodiment.

Figure 17:
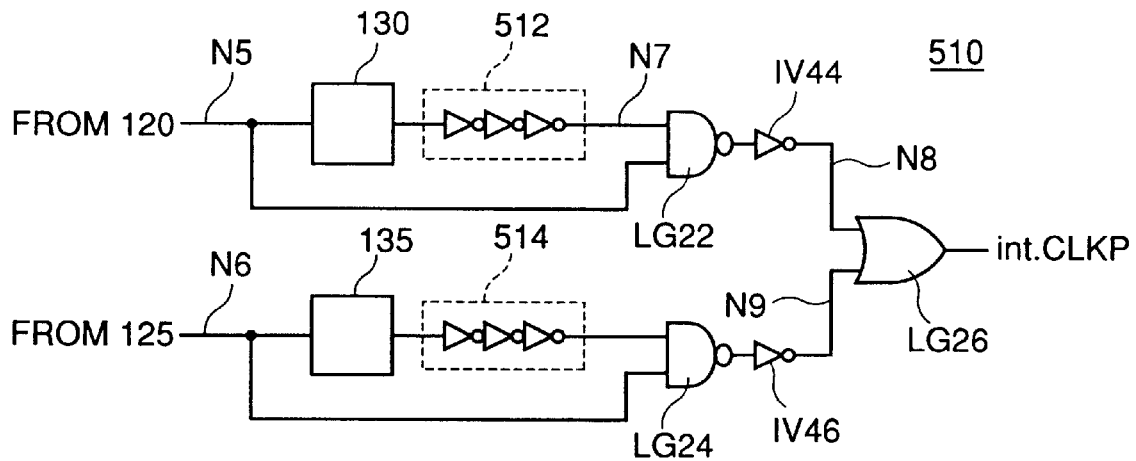

FIG. 17 is a circuit diagram representing a configuration of a level shift/pulse generating circuit 510.

Figure 18:
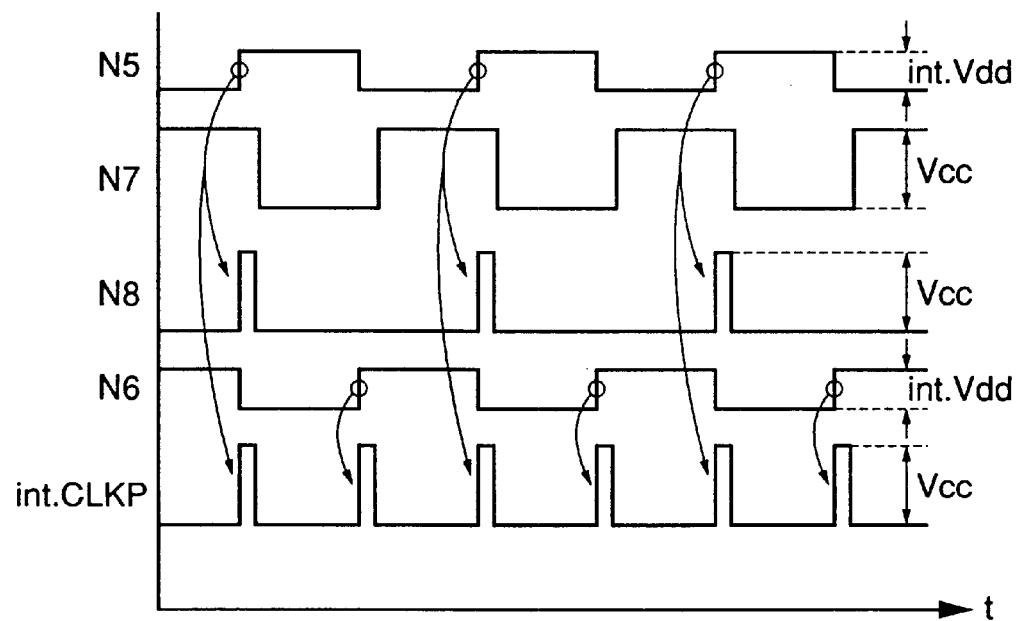

FIG. 18 is a timing chart related to an operation of level shift/pulse generating circuit 510.

Figure 19:
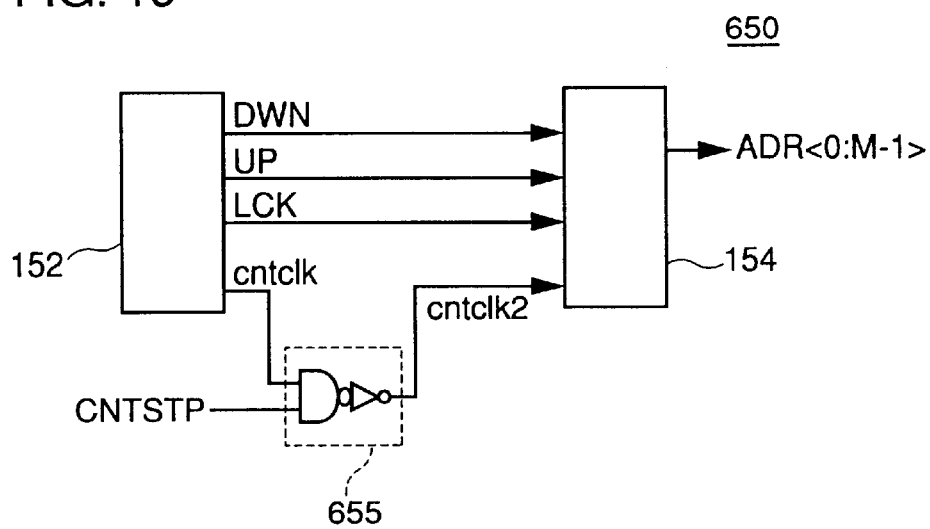

FIG. 19 is a block diagram representing a configuration of a phase difference control circuit 650 in accordance with a sixth embodiment.

Figure 20:
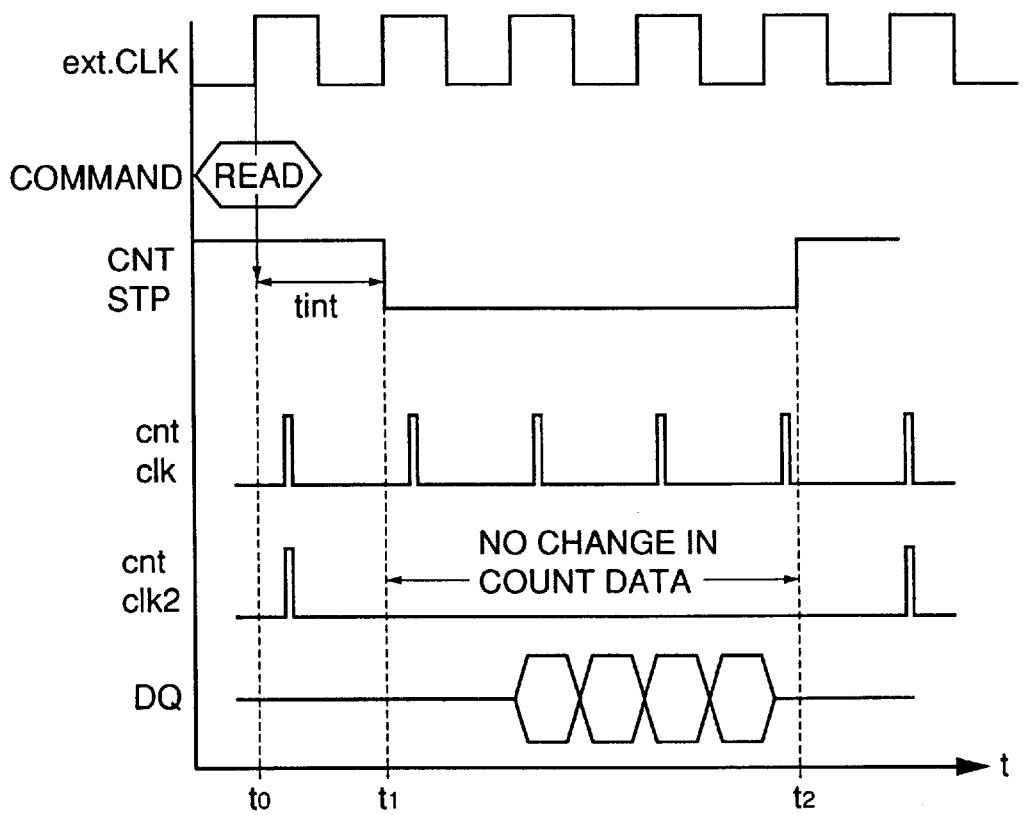

FIG. 20 is a timing chart representing an operation of phase difference control circuit 650.

Figure 21:
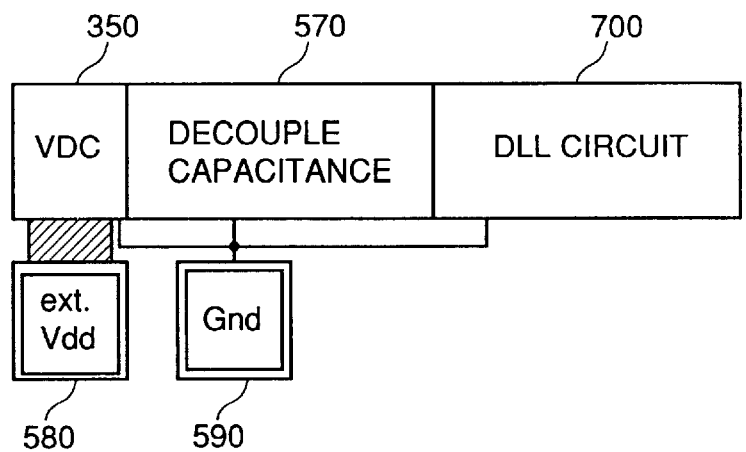

FIG. 21 is a schematic diagram representing supply of driving power supply to a DLL circuit 700 in accordance with a seventh embodiment.

Figure 22:
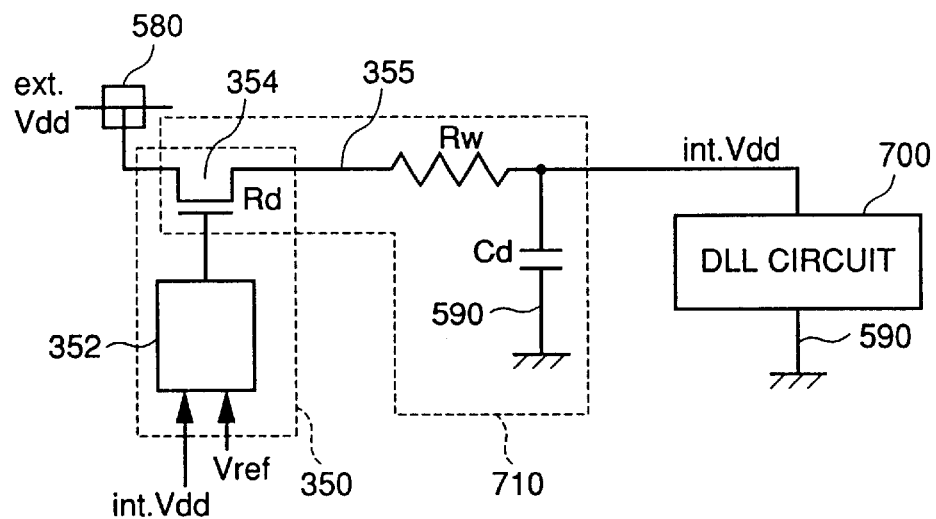

FIG. 22 is a block diagram representing a configuration of a lowpass filter formed at an input stage of DLL circuit 700.

Figure 23:
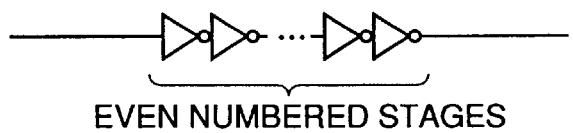

FIG. 23 is a circuit diagram representing a configuration of a general delay replica circuit.

FIGS. 24A to 24D are circuit diagrams representing configuration and operation of an antifuse circuit.

Figure 25:
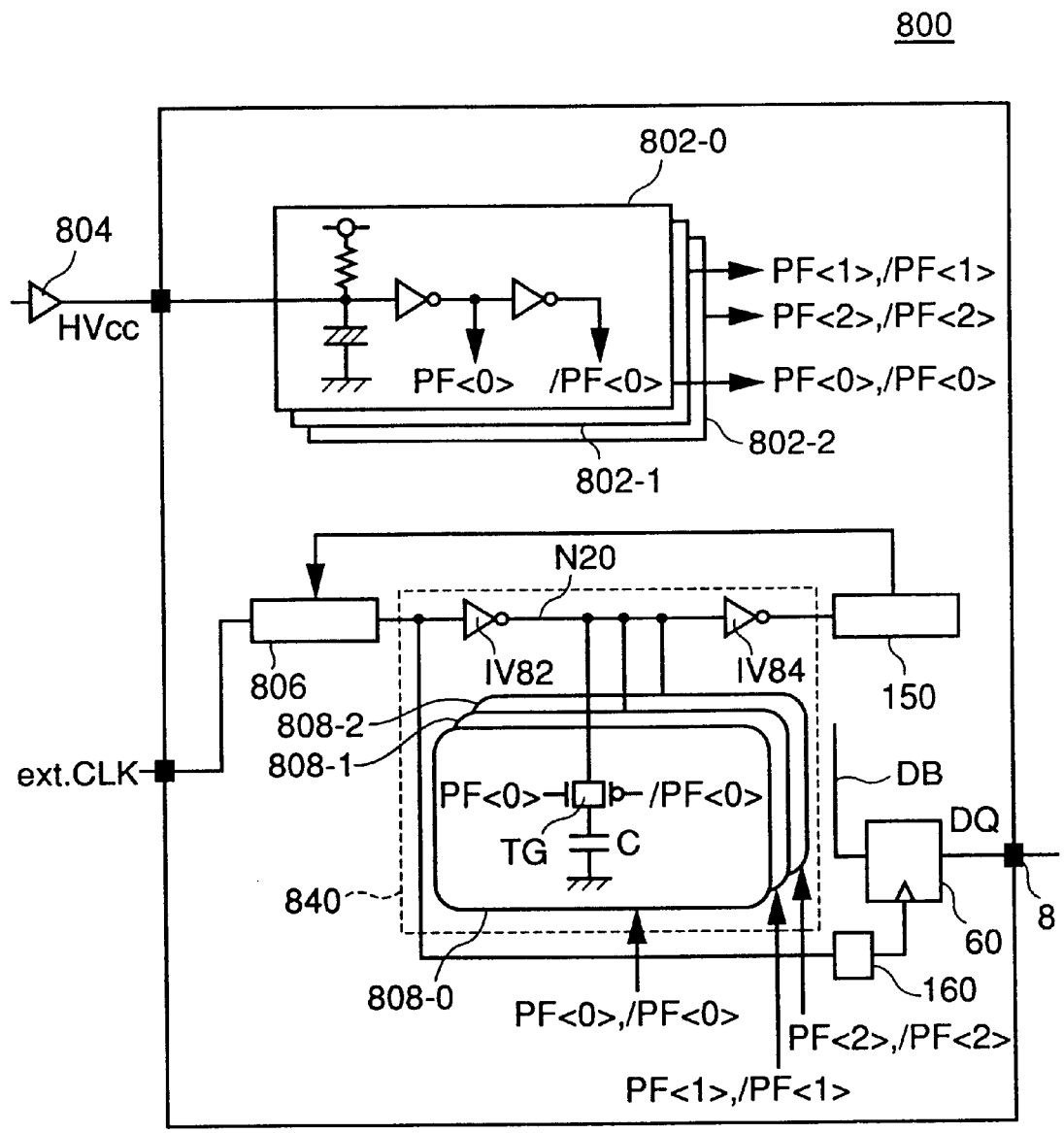

FIG. 25 is a block diagram representing a configuration of a delay replica circuit 840 in a DLL circuit 800 in accordance with an eighth embodiment.

Figure 26:
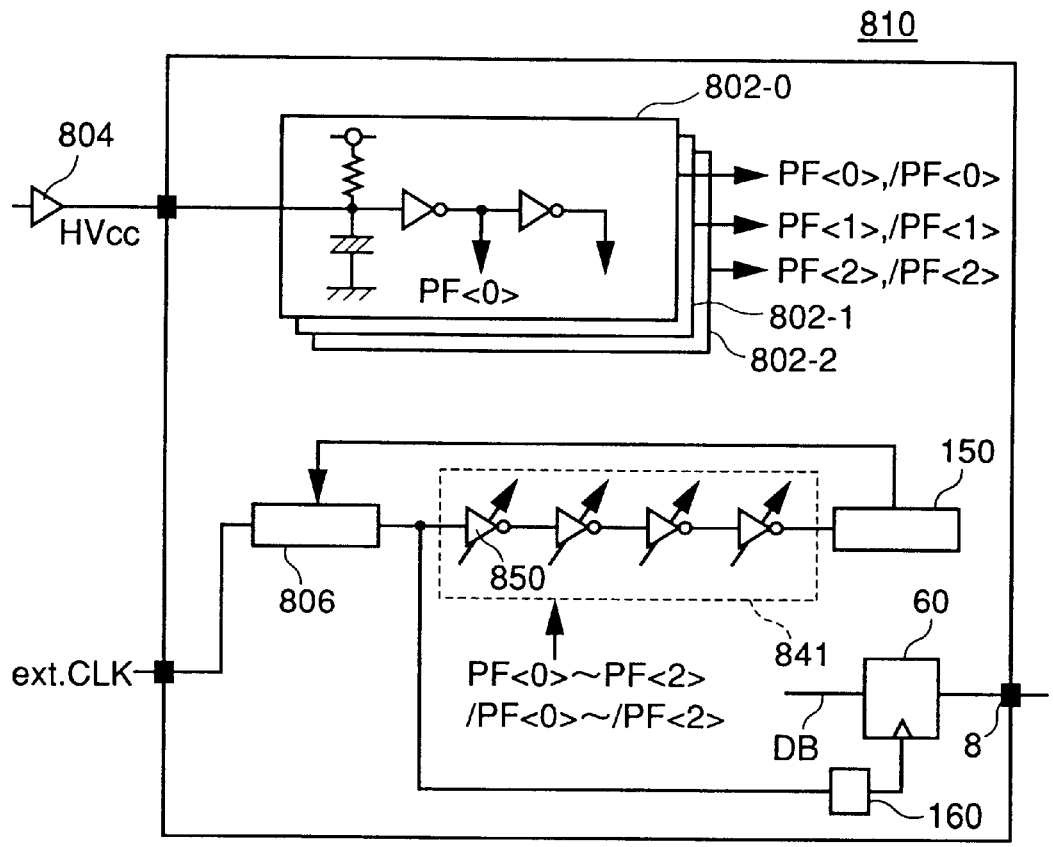

FIG. 26 is a block diagram representing a configuration of a delay replica circuit 841 in a DLL circuit 810 in accordance with a modification of the eighth embodiment.

Figure 27:
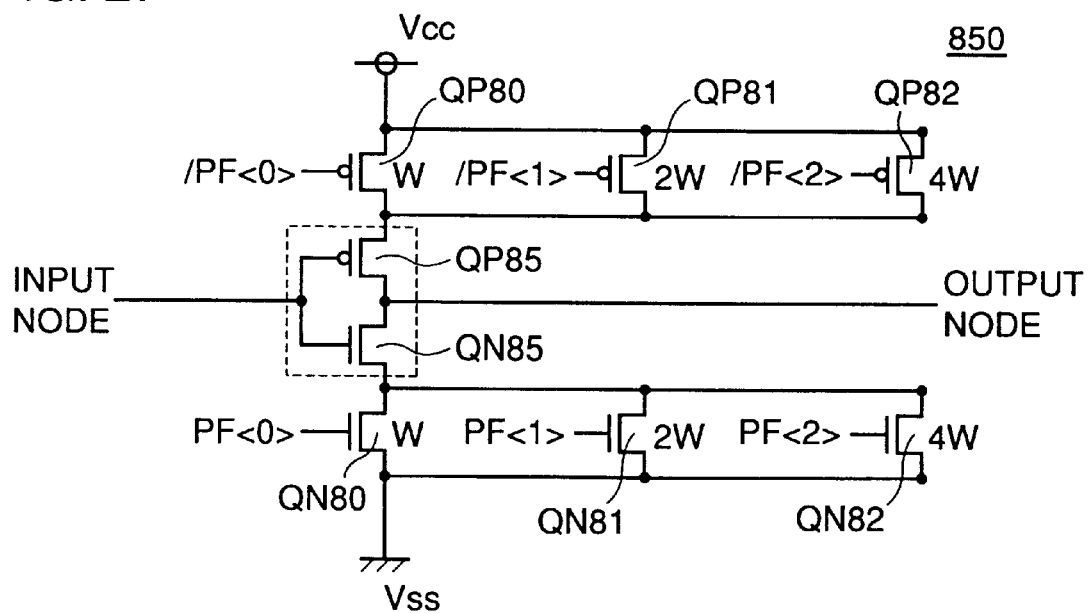

FIG. 27 is a circuit diagram representing a configuration of a delay time variable inverter 850.

Figure 28:
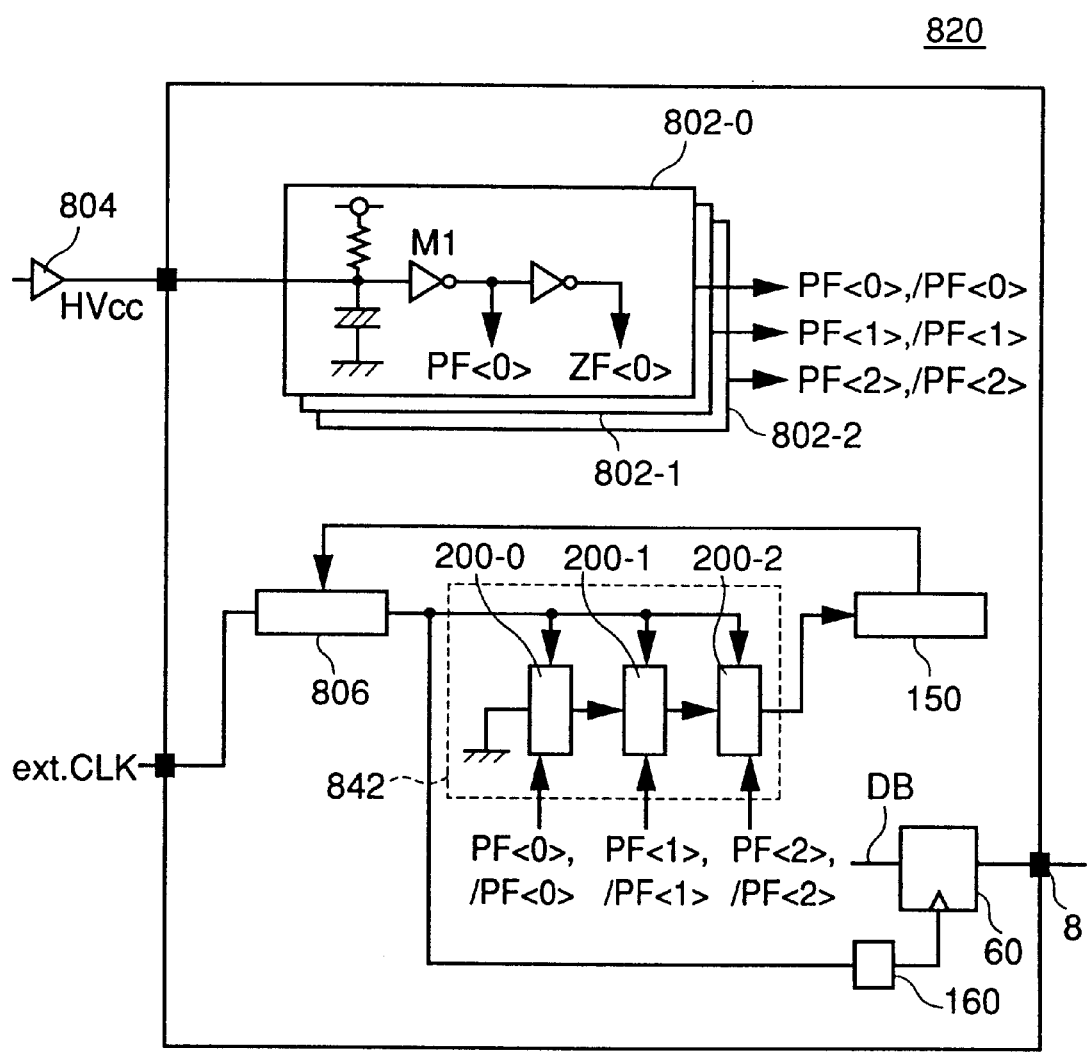

FIG. 28 is a block diagram representing a configuration of a delay replica circuit 840 in a DLL circuit 820 in accordance with a second modification of the eighth embodiment.

Figure 29:
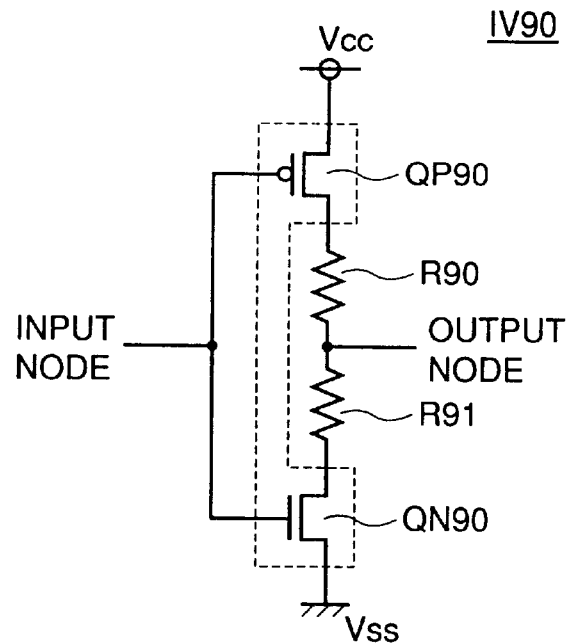

FIG. 29 is a circuit diagram representing a configuration of an inverter IV90 in accordance with a ninth embodiment.

Figure 30:
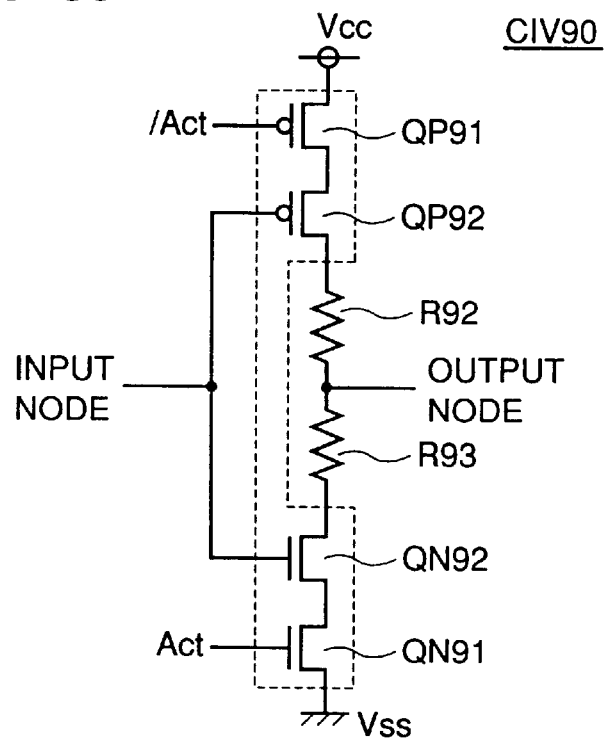

FIG. 30 is a circuit diagram representing a configuration of a clocked inverter CIV90 in accordance with the ninth embodiment.

Figure 31:
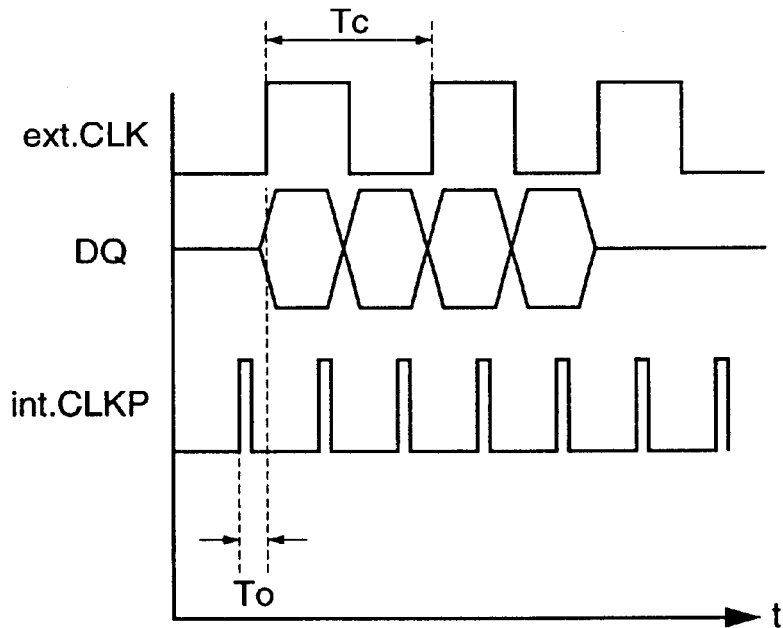

FIG. 31 is a timing chart related to operation timing of a DDR-SDRAM.

Figure 32:
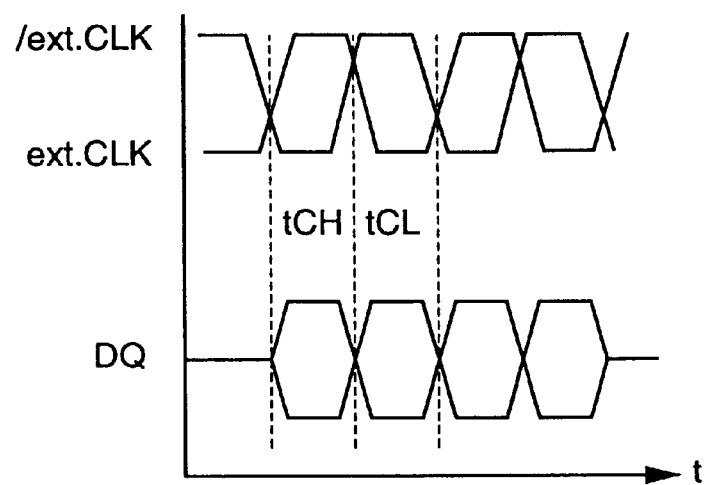

FIG. 32 is a timing chart representing SSTL2 standard.

Figure 33:
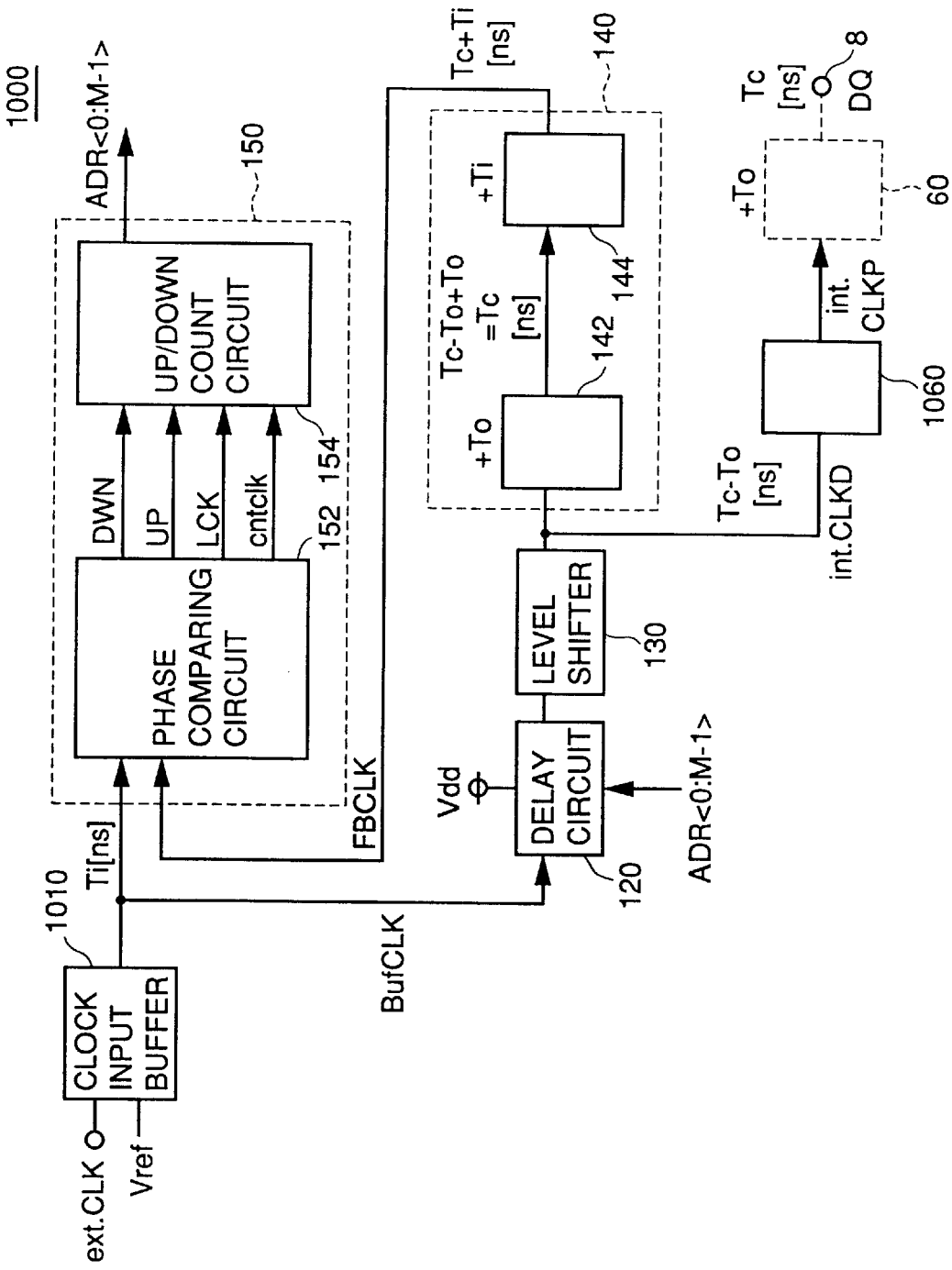

FIG. 33 is a block diagram representing a configuration of a conventional DLL circuit 1000 used in a synchronous semiconductor memory device.

Figure 34:
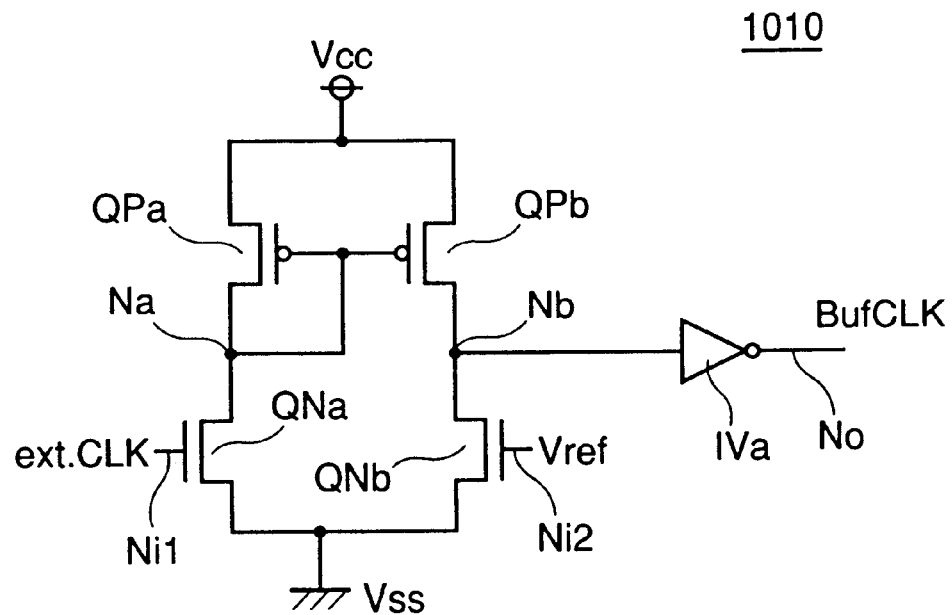

FIG. 34 is a circuit diagram representing a configuration of a clock input buffer 1010.

Figure 35:
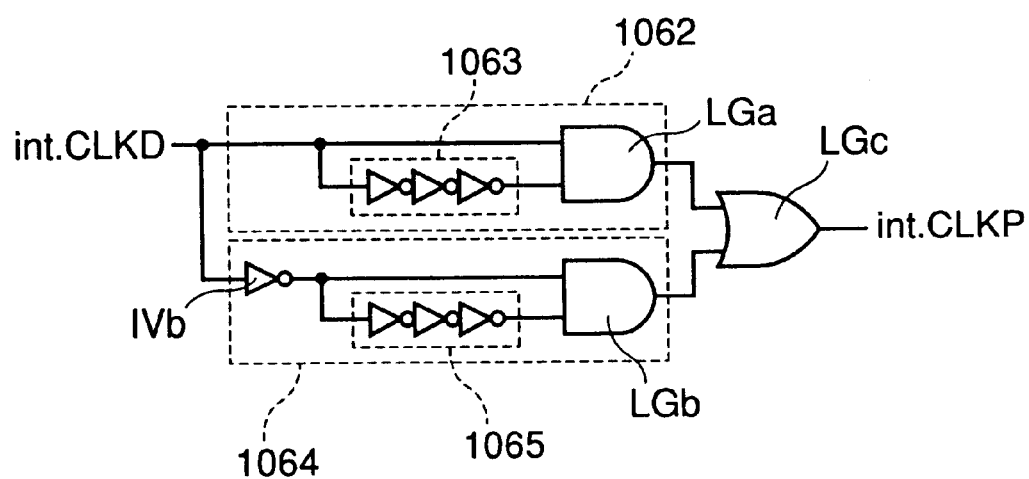

FIG. 35 is a circuit diagram representing a configuration of a pulse generating circuit 1060.

Figure 36:
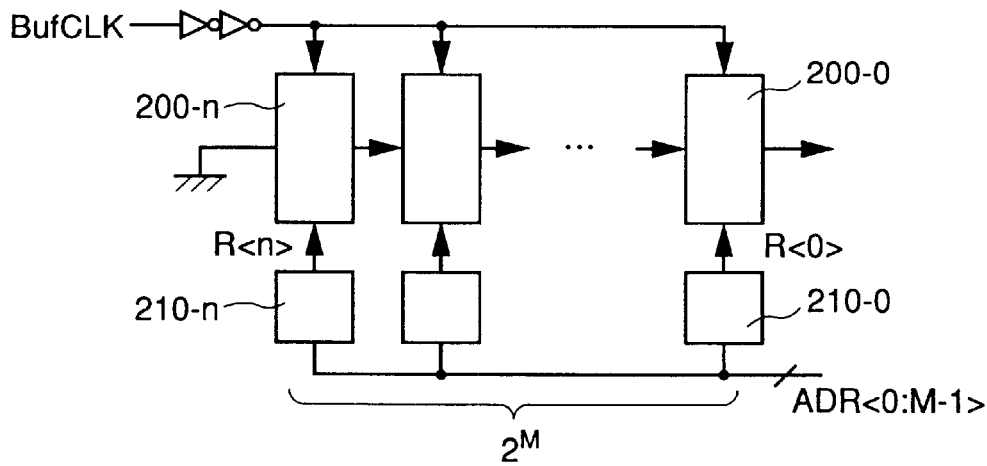

FIG. 36 is a block diagram representing a configuration of a delay circuit 120.

Figure 37:
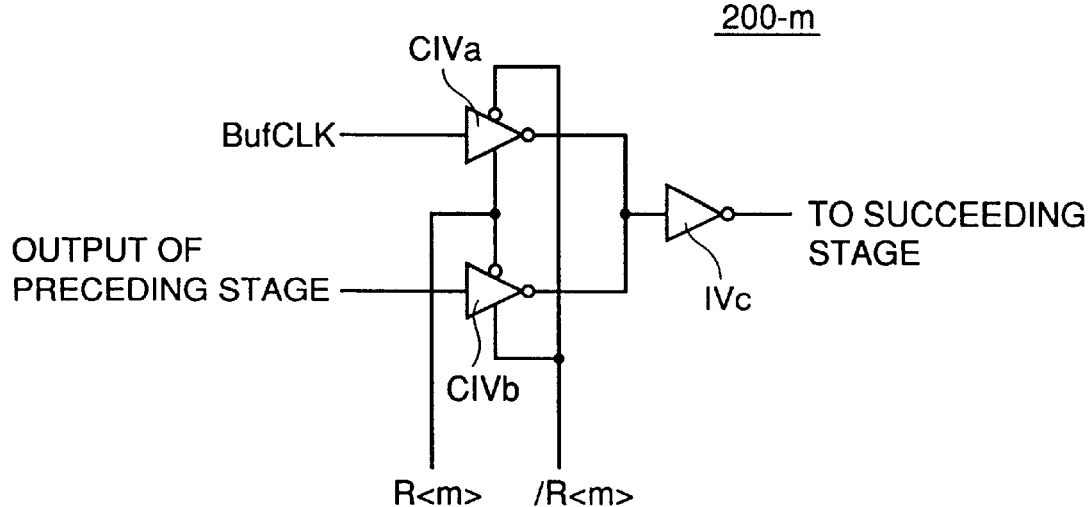

FIG. 37 is a circuit diagram representing a configuration of a delay unit.

Figure 38:
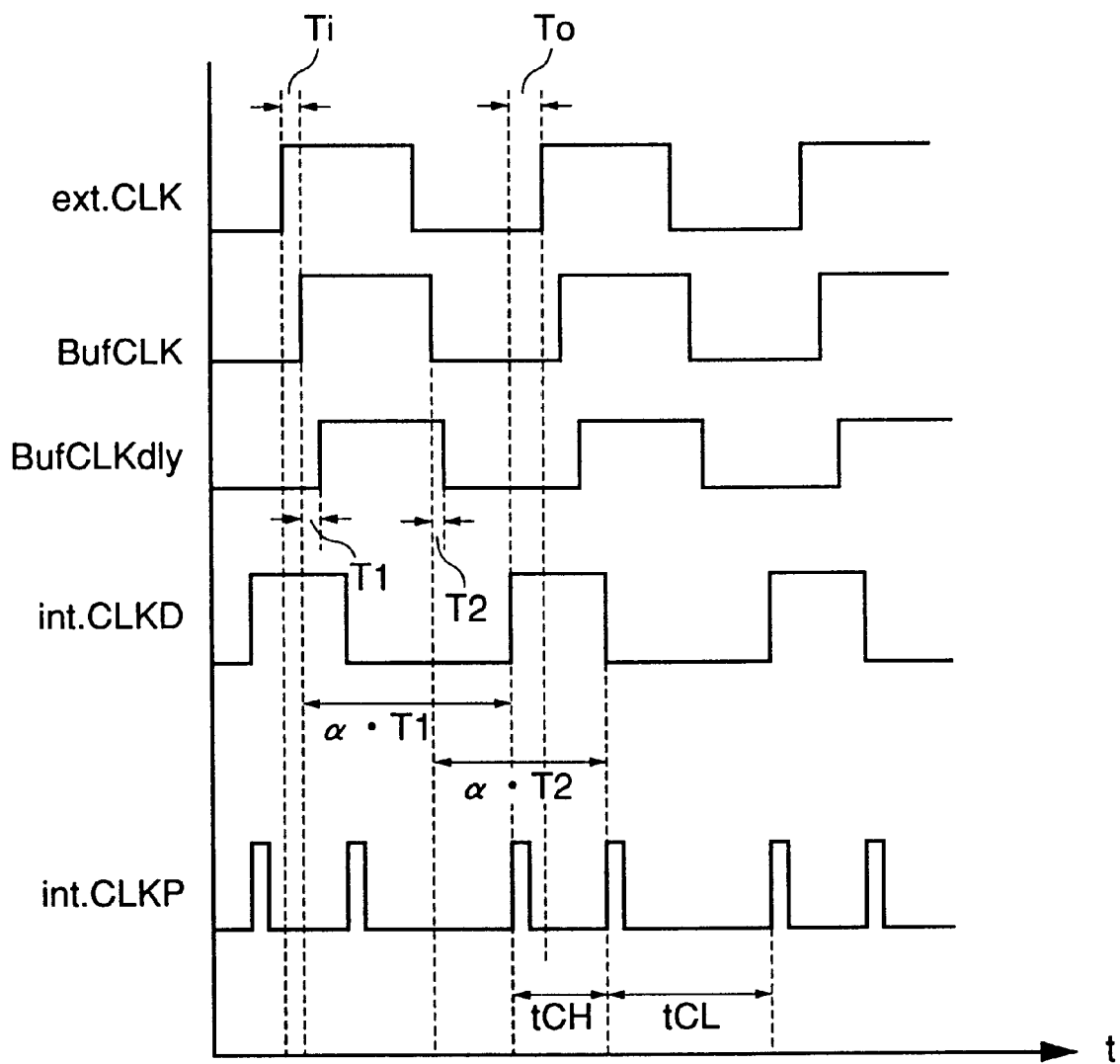

FIG. 38 is a timing chart representing a problem of the conventional DLL circuit 1000.

DESCRIPTION OF THE PREFERRED EMBODIMENTS

In the following, embodiments of the present invention will be described in detail with reference to the figures. In the figures, the same reference characters denote the same or corresponding portions.

[First Embodiment]

Figure 1:
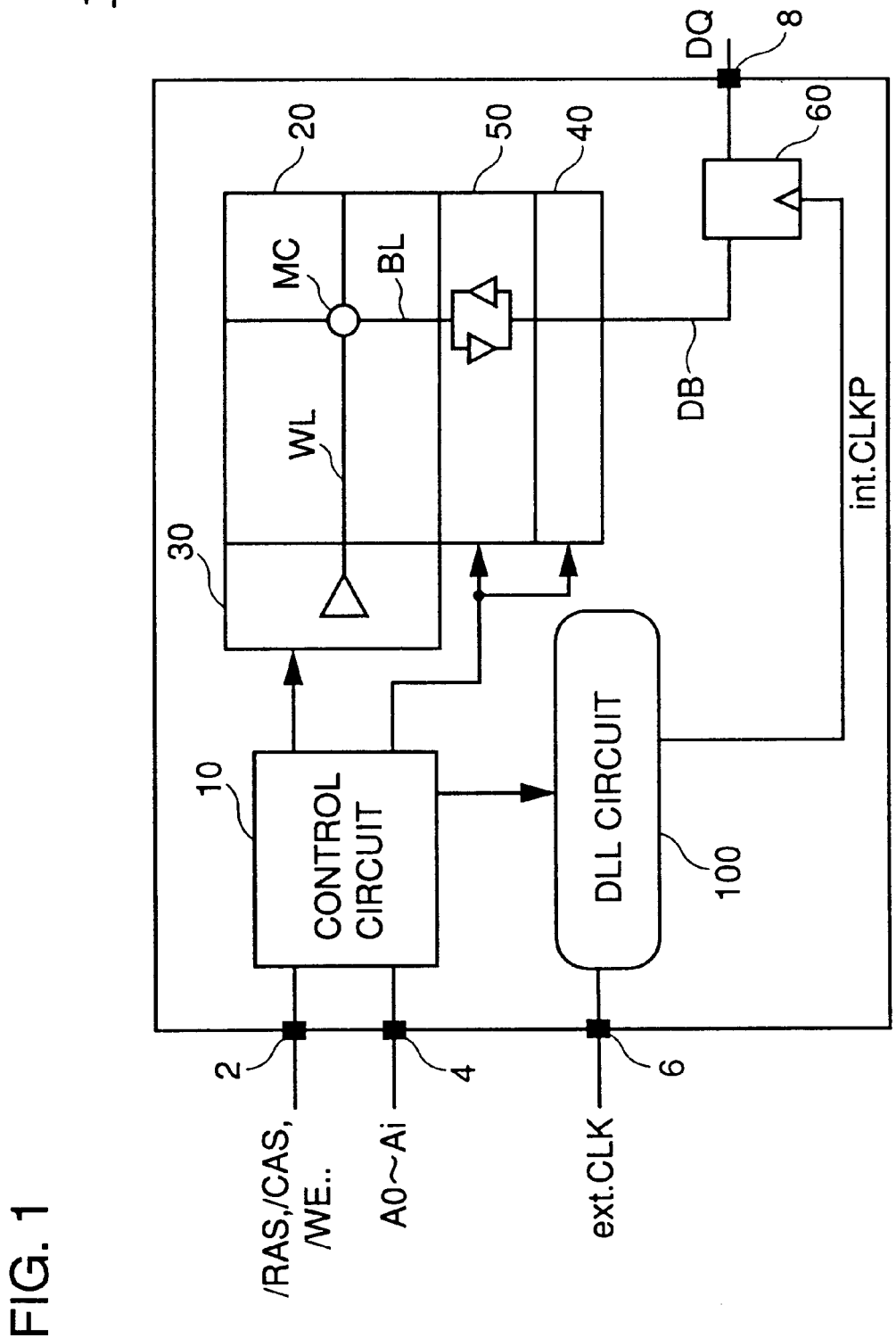
FIG. 1 is a schematic block diagram representing an overall configuration of a semiconductor memory device 1 provided with a DLL circuit in accordance with a first embodiment of the present invention.

FIG. 1 is a schematic block diagram representing a configuration of a semiconductor memory device 1 including a DLL circuit in accordance with a first embodiment of the present invention.

Referring to FIG. 1, the semiconductor memory device 1 includes a control signal input terminal 2 receiving control signals such as a row address strobe signals /RAS, a column address strobe signal /CAS and a write enable signal /WE, an address input terminal 4 receiving respective bits A0 to Ai of an address signal, a clock terminal 6 receiving an external clock signal ext.CLK, and a data input/output terminal 8 for communicating data.

Semiconductor memory device 1 further includes a control circuit 10 receiving the control signals and the address signal from control signal input terminal 2 and address input terminal 4, respectively, and controlling overall operation of the semiconductor memory device, and a memory cell array 20 having a plurality of memory cells arranged in a matrix of rows and columns. In memory cell array 20, there are provided word lines WL provided corresponding to respective rows of memory cells, and bit lines BL provided corresponding to respective columns of the memory cells. At an intersection between a word line WL and a bit line BL, a memory cell MC is arranged. FIG. 1 shows, as an example, arrangement of respective signal lines for a single memory cell.

Semiconductor memory device 1 further includes a row decoder 30 for selectively driving a word line WL, a column decoder 40 for selecting a column of memory cells corresponding to the address signal, a read/write circuit 50 for executing reading or writing of input/output data between the column of memory cells selected by the column decoder 40 and the corresponding bit line BL, a data bus DB for transmitting read/write data, and output buffer 60 transmitting the read data on data bus DB to data input/output terminal 8. An externally input write data is transmitted through an input buffer (not shown) to data bus DB, and written to the selected memory cell by read/write circuit 50.

Semiconductor memory device 1 further includes a DLL circuit 100 receiving an external clock signal ext.CLK and generating an internal clock pulse int.CLKP. Internal clock pulse int.CLKP is transmitted to output buffer 60. Output buffer 60 outputs output data transmitted by data bus DB to data input/output terminal 8 in synchronization with both rising and falling edges of external clock signal ext.CLK, in response to an activation timing of internal clock pulse int.CLKP. Data output delay time in the output buffer is To. Because of this configuration, the semiconductor memory device 1 can operate as a DDR-SDRAM.

FIG. 2 is a block diagram representing an overall configuration of DLL circuit 100 in accordance with the first embodiment of the present invention.

Referring to FIG. 2, DLL circuit 100 includes clock input buffers 110 and 115. Clock input buffer 110, having a similar structure as clock input buffer 1010 described with reference to FIG. 34, receives external clock signal ext.CLK at an input node Ni1, and receives a signal /ext.CLK which is an inversion of the external clock signal, at an input node Ni2. Clock input buffer 115, also having the similar configuration as clock input buffer 1010 described with reference to FIG. 34, receives the signal /ext.CLK at an input node Ni1 and receives as an input the external clock signal ext.CLK at an input node Ni2. Clock input buffers 110 and 115 output clock signals BufCLKR and BufCLKF, respectively, which rise or fall in response to the timing when the signals ext.CLK and /ext.CLK cross each other. More specifically, clock signal BufCLKR rises to the H level at a timing when voltage levels of the signals satisfy ext.CLK>/ext.CLK, and falls at a timing when /ext.CLK>ext.CLK. By contrast, the clock signal BufCLKF rises at a timing when the voltage levels of these signals come to satisfy the relation /ext.CLK>ext.CLK, and falls at the timing when ext.CLK>/ext.CLK. BufCLKR is a clock signal generated in response to a rising edge of external clock signal ext.CLK. The signal BufCLKF has its phase inverted from that of clock signal BufCLKR and, in other words, it is a clock signal activated in response to a falling edge of external clock signal ext.CLK. The delay time added by the clock input buffer will be represented as Ti.

DLL circuit 100 further includes a delay circuit 120, a level shifter 130 and a delay replica circuit 140, arranged between clock input buffer 110 and phase difference control circuit 150 and forming a delay loop.

Level shifter 130 converts voltage level of an output signal of delay circuit 120 and outputs a signal int.CLKR. Generally, it is necessary to drive the delay circuit at a low voltage supplied by a power supply circuit provided independently, in order to reduce variation in delay amount. Therefore, when an output signal from the delay circuit is to be used in other circuitry, such a level shifter is necessary.

Delay replica circuit 140 is provided to eliminate influence of delay times generated in output buffer 60 and clock input buffer 110 to attain synchronization with the external clock signal at an appropriate timing, by providing these delay times as dummy delay times. Delay replica circuit 140 includes an output buffer replica circuit 142 for adding the delay time To generated in output buffer 60, and an input buffer replica circuit 144 for adding a delay time Ti generated by clock input buffer 110.

DLL circuit 100 further includes a phase difference control circuit 150 for controlling phase difference between clock signal BufCLKR and the feedback clock signal FBCLK which has passed through the delay loop.

Phase difference control circuit 150 includes a phase comparing circuit 152 comparing phase difference between clock signal BufCLKR and feedback clock signal FBCLK and outputting count designating signals DWN, UP and LCK, and an up/down count circuit 154 setting count data ADR<0:M−1> in accordance with the count designating signals.

Of the count designating signals, the signal UP is activated (H level) when the phase of the feedback clock signal FBCLK is advanced from clock signal BufCLKR, and the signal DWN is activated (H level) when the phase of feedback clock signal FBCLK is lagging behind clock signal BufCLKR. The signal LCK is activated (H level) when it is detected that the clock signals BufCLKR and FBCLK have matching phases (in the following, also referred to as a locked state). Count clock signal cntclk is a clock signal related to the count operation of up/down count circuit 154.

Up/down count circuit 154 increments delay control amount for setting delay amount in the delay circuit in response to activation of the count designating signal UP, and decrements the delay control amount in response to activation of the count designating signal DWN. When the signal LCK is active, it means a locked state, and therefore the delay control amount is maintained. Up/down count circuit 154 increases/decreases the delay control amount so that clock signals BufCLKR and FBCLK are synchronized, and sets count data ADR<0:M−1>. Count data ADR<0:M−1> is a signal of M bits (M: natural number) representing the delay control amount.

Count data ADR<0:M−1> is applied commonly to delay circuits 120 and 125, and in these delay circuits, the delay time in accordance with the count data is added to the input signal. Phase comparing circuit 152 generates the signal cntclk, which is an operation clock signal of up/down count circuit 154. Up/down count circuit 154 operates in response to the signal cntclk.

As described above, the delay feedback loop formed for clock signal BufCLKR is similar to that of the DLL circuit 100 described with respect to the prior art.

DLL circuit 100 in accordance with the first embodiment further includes a delay circuit 125 and a level shifter 135. DLL circuit 100 in accordance with the first embodiment is characterized in that it has a delay line capable of adding equal delay time both to the rising and falling edges of the external clock signal.

Delay circuit 125 is controlled by the count data ADR<0:M−1> common to delay circuit 120. Level shifter 135 converts voltage level of an output signal of delay circuit 125 and outputs the signal int.CLKF.

DLL circuit 100 further includes a pulse generating circuit 160 outputting an internal clock pulse int.CLKP based both on the signal int.CLKF output from level shifter 135 and on int.CLKR. Internal clock pulse int.CLKP is transmitted to output buffer 60 to be a trigger signal for data reading from semiconductor memory device 1.

Delay circuits 120 and 125 have the same configuration as delay circuit 120 of the prior art described with reference to FIG. 36, and has delay units 200-0 to 200-n (n: natural number of $2^m-1$) connected in series.

FIG. 3 is a circuit diagram representing a configuration of delay unit 200. FIG. 3 shows a circuit configuration of mth delay unit 200-m (m: natural number from 1 to n-1. Referring to FIG. 3, delay unit 200-m includes clocked inverters CIV1 and CIV2, controlled by a control signal R<m> and its inverted signal /R<m>. Clocked inverter CIV1 operates in response to activation of control signal R<m>, receives the clock signal BufCLKR or BufCLKF, inverts the same and outputs the result. Clocked inverter CIV2 inverts an output of delay unit 200-(m−1) arranged in the preceding stage and outputs the result. Delay unit 200-m further includes an inverter IV1. An input node of inverter IV1 is connected to output nodes of clocked inverters CIV1 and CIV2, and an output node of inverter IV1 is connected to an input node of a clocked inverter CIV2 of delay unit 200(m+1) of the next stage. As described above, the configuration of delay unit 200 is the same as that described with reference to FIG. 37, and the delay time T1 added to the rising edge and delay time T2 added to the falling edge by a single delay unit is represented as T1=Tf (CIV)+Tr (IV) and T2=Tr (CIV)+Tf (V) respectively, as described in the prior art.

FIG. 4 is a circuit diagram representing a configuration of a pulse generating circuit 160.

Referring to FIG. 4, pulse generating circuit 160 includes one shot pulse generating circuits 162 and 164, and a logic gate LG14. One shot pulse generating circuit 162 includes odd-numbered inverters 163 inverting and delaying clock signal int.CLKR, and a logic gate LG10 performing an AND operation using an output of inverter group 163 and clock signal int.CLKR as two inputs and providing the result.

One shot pulse generating circuit 162 generates a one shot pulse in response to the rising edge of clock signal int.CLKR. One shot pulse generating circuit 164 has the same configuration, and generates a one shot pulse in response to a rising edge of clock signal int.CLKF. Logic gate LG14 outputs the result of OR operation of output signal generated from one shot pulse generating circuits 162 and 164.

Because of this configuration, pulse generating circuit 160 activates the internal clock pulse int.CLKP in response to rising edges of both int.CLKR and int.CLKF.

FIG. 5 is a timing chart representing the operation of DLL circuit 100 in accordance with the first embodiment.

Referring to FIG. 5, the period of external clock signal ext.CLK is Tc. By clock input buffers 110 and 115, clock signals BufCLKR and BufCLKF are output, respectively. Between external clock signal ext.CLK and clock signal BufCLKR, there is generated a phase difference of delay time Ti added by clock input buffer 110. Clock signal BufCLKF is a signal having inverted phase to clock signal BufCLKR, and hence it can be considered as a signal activated in response to the falling edge of external clock signal ext.CLK.

Clock signal BufCLKR is input to phase difference control circuit 150, and synchronized with feedback clock signal FBCLK obtained through the delay loop. In order to eliminate the influence of data output delay time To consumed in the buffer circuit at the time of data output, the internal clock signal int.CLKR is set to a state delayed by Tc−To from external clock signal ext.CLK in the locked state. When the decoded value of count data ADR<0:M−1> in the locked state, that is, the delay control amount, is represented as α, phase delay of internal clock signal int.CLKR from clock signal BufCLKR is represented as α19 T1.

Another clock signal BufCLKF has the delay time added by delay circuit 125 controlled by the count data ADR <0:M−1> common to the delay circuit 120, and therefore, the phase delay of internal clock signal int.CLKF from clock signal BufCLKF is represented as α·T1.

Internal clock pulse int.CLKP is activated in response to each of the rising edges of internal clock signals int.CLKR and int.CLKF. Therefore, eventually, pulse signals corresponding to the rising and falling edges of the external clock signal can be obtained approximately at the equal interval. Namely, in DLL circuit 100, there is not much difference between tCH and tCL.

Therefore, when data output is executed using the internal clock pulse generated by DLL circuit 100 in accordance with the first embodiment of the present invention as a trigger signal, it becomes possible even in a DDR-DRAM to execute data output at timings synchronized both with the rising and falling edges of the external clock signal, in accordance with SSTL2 standard.

[Second Embodiment]

In the second embodiment, a configuration will be described which further reduces jitter at the data output timing by further dividing minimum control unit of delay time in the delay circuit.

In the delay circuits 120 and 125 of the DLL circuit in accordance with the first embodiment, the total of delay times added by clocked inverters and inverters constituting the delay unit 200 is the minimum controllable unit of delay time (in the following, also referred to as a minimum control delay time). Considered in an actual circuit formed on a semiconductor memory device, the minimum delay control time is about 0.25 to 0.40 [ns], which cannot be considered a sufficiently fine value.

One factor restricting jitter of the clock signal in the DDR-SDRAM is an access time tAC from the clock signal. The range of variation of the access time tAC on the specification is required to be ±0.075·Tc (Tc: period of the clock signal). For example, when the operational frequency is 133 MHz, Tc=7.5 [ns], and the tolerable range of variation of the access time tAC is ±0.05625 [ns]. When this value is compared with the minimum delay control time, adjustable margin is not very large, and it can be understood that it is necessary to more delicately set the minimum delay control time in the delay circuit.

In the second embodiment, in place of delay circuit 120 of the DLL circuit 100 in accordance with the first embodiment, a delay circuit 220 having such a structure as shown in FIG. 6 is used. Further, in place of delay circuit 125, a delay circuit 225 having the same configuration as delay circuit 220 is used.

FIG. 6 is a block diagram representing a configuration of delay circuit 220 in accordance with the second embodiment.

Referring to FIG. 6, delay circuit 220 includes an inverter IV10 inverting the clock signal BufCLKR and outputting the result to node N1, sub delay units 205-0 to 205-2 connected in parallel between the node N1 and the ground line, an inverter IV15 inverting signal level at node N1 and outputting the result to node N2, and delay units 200-0 to 200-N connected to node N2. When count data ADR<0:M−1> is a signal of M bits, the value N is given as N=$2^{(M-3)}$−1. Delay units 200-0 to 200-N are connected in series with each other and configuration of each unit is as described with reference to FIG. 3. The delay time added by one delay unit will be represented as tdc.

Each of the sub delay units 205-0 to 205-2 has an N type MOS transistor and a capacitor coupled in series between node N1 and the ground line. Sub delay unit 205-0 includes an N type MOS transistor QN0 receiving at its gate the control signal R<0> and a capacitor having capacitance value 1C. Sub delay unit 205-1 has an N type MOS transistor QN1 receiving at its gate the control signal R<1> and a capacitor having capacitance value 2C. Sub delay unit 205-2 has an N type MOS transistor QN2 receiving at its gate the control signal R<2> and a capacitor having capacitance value 4C. Sub delay units 205-0 to 205-2 are selected in response to lower three bits of count data ADR<0:M−1>, that is, ADR<0:2>.

More specifically, control signal R<0> corresponds to the least significant bit ADR<0> of the count data, and control signals R<1> and R<2> correspond to count signals ADR<1> and ADR<2>, respectively. By the activation of control signals R<0> to R<2> (H level), capacitors come to be coupled between node N1 and the ground voltage, and delay is added to the signal transmitted over node N1. When the delay time added by sub delay unit 205-0 having the capacitor of capacitance value 1C is represented as tdf, the eight different delay times of 0 to 7·tdf can be set by the combination of least significant 3 bits ADR<0:2> of the count data.

Decode circuits 210-0 to 210-N are arranged corresponding to delay units 200-0 to 200-N, respectively. Decode circuits 210-0 to 210-N selectively activate delay units 200-0 to 200-N, in response to higher bits ADR<3:M−1> of the count data.

FIG. 7 shows correspondence between count data ADR<0:M−1> and control signal R<0:n> in delay circuit 220.

Referring to FIG. 7, corresponding to the count value (delay control amount) which corresponds to decimal representation of count signal ADR<0:M−1>, signal levels of control signals R<0> to R<n> are set. In delay circuit 220, every time the count value increases by one, lower bits R<0> to R<2> of the control signal corresponding to the sub delay unit are incremented one by one. When the count value is 7, the control signals R<0> to R<2> are each "1". When the count value is further increased to 8, the higher bit R<3> corresponding to the delay unit attains to "1", and the lower bits R<0> to R<2> are cleared to "0".

As the count value further increases, the lower bits R<0> to R<2> are incremented and when the count value reaches 15, R<0> to R<3> of the control signals are set to "1". When the count value is further increased to 16, the lower bits R<0> to R<2> are cleared to "0", and the bit which is to be activated among the higher bits is carried up by one. More specifically, in place of control signal R<3>, the control signal R<4> attains to "1". In this manner, the lower three bits of the control signals are incremented successively, and when the lower bits all attain to "1" and the count is further incremented, the bit to be activated among the higher bits is carried one by one. As the bit to be activated among the higher bits is carried successively, the delay time added by delay units 200-0 to 200-N is increased by tdc at a time.

When the delay time tdf added by sub delay unit 205-0 having the capacitor of capacitance value 1C is set to be about ⅛ of the time tdc, it becomes possible to change smooth the delay time added by the delay circuit 220 as a whole in accordance with the increase of delay control amount. Further, lower bits R<0> to R<2> of the control signal may have the same values as the lower 3 bits ADR<0> to ADR<2> of the count signal, respectively, and the higher bits R<3> to R<n> of the control signal may be determined in accordance with the result of decoding the higher bits ADR<3:M−1> of the address signal.

In FIG. 6, the number of sub delay units and the number of lower bits of the count signal are set to "3", and the unit delay amount added by the sub delay unit is adapted to be set in eight different steps (=$2^3$). However, these values are examples only. Generally, by a configuration in which J sub delay units are controlled by lower J bits of count signal ADR<0:M−1>, it is possible to set the delay time generated by the sub delay units in $2^J$ steps.

FIG. 8 is a schematic diagram representing relation between the count value of the DLL circuit and the delay time added by the delay loop, in accordance with the second embodiment.

Referring to FIG. 8, when the count value is 0, the sum of the delay time Ti+To added by delay replica circuit 140 and the value tdc added by delay unit 200-0 is the delay time added to the clock signal BufCLKR. As the count value is incremented one by one, delay time increases by tdf at a time, and when the count value is incremented from 7 to 8, the delay time added by the sub delay units is cleared and the delay time will be Ti+To+2·tdc.

When the total delay time reaches the period Tc of the external clock signal, the DLL loop is locked, and up/down count circuit 154 maintains the delay control amount at the locked state, in response to activation of the control signal LCK. Assuming that the locked state is attained with the count value 7, the jitter in this case is represented as (Ti+To+7·tdf−Tc).

In the DLL circuit in accordance with the second embodiment, delay circuit 225 has the same circuit configuration as delay circuit 220, and controlled by the count signal ADR<0:M−1> which is common to the delay circuit 220. Delay circuit 225 is different in that the signal BufCLKF is applied in place of clock signal BufCLKR, to the input node of inverter IV10 shown in FIG. 6.

As delay circuits 220 and 225 have such a configuration as described above, it becomes possible to more delicately set the delay time in the DLL circuit, and hence it becomes possible to reduce jitter at the time of locking.

[Third Embodiment]

In the third embodiment, an arrangement of a delay unit will be described which can further reduce the difference between delay times added by delay circuits 120 and 125 provided parallel to each other, in DLL circuit 100 in accordance with the first embodiment described with reference to FIG. 2.

FIG. 9 is a block diagram representing an example of the arrangement of delay circuits 120 and 125.

Referring to FIG. 9, a voltage generating circuit 350 hereinafter also referred to as a VDC: Voltage Down Converter) provided dedicated for the delay circuit generates a driving voltage int.Vdd for the delay circuit. Driving voltage int.Vdd is supplied to each delay unit in the delay circuit by power supply line 355. Delay circuits 120 and 125 are arranged in separate areas, and in FIG. 9, delay circuit 120 is arranged closer to voltage generating circuit 350. Delay circuit 120 includes delay units 200R-0 to 200R-n, and delay circuit 125 includes delay units 200F-0 to 200F-n. Therefore, the distance from voltage generating circuit 350 to the delay units is the shortest at 200R-0 and longest at 200F-n, becoming longer in the order of 200R-0 to 200R-n and to 200F-0 to 200F-n. The purpose of such an arrangement is to minimize the line length.

In the configuration of FIG. 9, however, the levels of driving voltages for respective delay units differ, dependent on the distance from the voltage generating circuit 350 on power supply line 355, because of the voltage drop resulting from line resistance of the power supply line 355. Meanwhile, delay circuits 120 and 125 are controlled by the common count signal. Therefore, when the delay control amount is α+1, the delay time is added as clock signal BufCLKR passes through units 200R-0 to 200R-α in delay circuit 120. Similarly, the delay time is added as the clock signal BufCLKF passes through delay units 200F-0 to 200F-α in delay circuit 125.

Therefore, in this configuration, because of the influence of voltage drop generated on power supply line 355, the delay time added by delay circuit 120 comes to be different from the delay time added by delay circuit 125. If this difference is so large as to cause much difference between tCH and tCL described with reference to FIG. 5, it would be difficult to obtain internal clock pulses synchronized both with the rising and falling edges of the external clock signal in the DDR-SDRAM.

FIG. 10 is a block diagram representing a configuration of delay units in the delay circuit in accordance with the third embodiment.

Referring to FIG. 10, a driving voltage int.Vdd of the delay circuit generated by voltage generating circuit 350 is supplied to delay circuits 120 and 125 by power supply lines 356 and 357 provided independently. Delay circuits 120 and 125 each have n+1 delay units, and the delay units are arranged such that kth delay units (k: integer of 0 to n) of respective delay circuits have approximately the same distance from the voltage generating circuit on respective power supply lines. Because of this configuration, the delay units 200R-0 to 200R-α and 200F-0 to 200F-α constituting the delay path corresponding to the delay control amount α+1 can be driven by the voltages of same levels respectively, and hence, difference in delay time added by the two delay circuits can be reduced.

Further, in delay circuits 120 and 125, the delay units are arranged such that the distance from the voltage generating circuit 350 becomes longer from the shortest distance at delay unit 200R-0 and 200F-0 corresponding to the lower bit of the count data, it becomes possible to supply driving power supply voltage which is more stable and experiences smaller voltage drop, to those delay units which are used with high frequency. Therefore, variation of the delay times added by the delay circuits can further be reduced.

In FIG. 10, the arrangement of delay units in delay circuits 120 and 125 have been described. When the arrangement of the delay units and the sub delay units provided in delay circuits 220 and 225 in accordance with the second embodiment are arranged in the similar manner, it is possible to reduce the difference in delay times set by the two delay circuits.

[Modification of the Third Embodiment]

FIG. 11 is a block diagram representing a configuration of the delay units in the delay circuit in accordance with a modification of the third embodiment.

Referring to FIG. 11, in the modification of the third embodiment, delay units 200R-0 to 200R-n and 200F-0 to 200F-n provided in delay circuits 120 and 125 are fed with the driving voltage through a commonly provided power supply line 355. The modification of the third embodiment is characterized in that delay units corresponding to delay circuit 120 and delay units corresponding to delay circuit 125 are arranged alternately. In FIG. 11, starting from the side closer to voltage generating circuit 350, delay units are arranged in the order of 200R-0, 200F-0, 200R-1, 200F-1, . . . , 200R-n and 200F-n. In the configuration of FIG. 11 also, the delay units corresponding to each other of delay circuits 120 and 125 are at approximately the same distance from the voltage generating circuit 350 on power supply line 355, and therefore the units are driven by driving voltage of approximately the same levels, and hence the difference in delay times added by the two delay circuits can be reduced.

Again in the configuration of FIG. 11, by arranging the delay units which are used frequently closer to the voltage generating circuit 350, similar effects as described with respect to the third embodiment can be attained.

Further, when the delay units and the sub delay units provided in the delay circuits 220 and 225 described in the second embodiment are arranged in the similar manner, the difference of delay times set in these two delay circuits can be reduced.

[Fourth Embodiment]

In the fourth embodiment, a configuration will be described in which output of the delay circuit is kept stable even when the delay times are set hierarchically as described in the second embodiment.

Again referring to FIG. 8, in the delay circuit in which the delay times added by the delay circuit is set hierarchically, there is such an operation timing at which the delay time added by the sub delay units is cleared and switched to a delay time added by the delay unit, as in the case where the count value increases from 7 to 8 in the example of FIG. 8.

At this time, when the difference between $(2^J-1)\cdot\text{tdf}$ corresponding to the lower J bit of the count signal corresponding to the sub delay unit ($2^J=8$ in FIG. 8) and the unit delay time tdc provided by the delay unit is large, the output signal level of the delay circuit may possibly drop instantaneously from H to L level because of switching of the count data. At this time, even when the drop to the L level is instantaneous, the internal clock pulse int.CLKP would be activated by pulse generating circuit 160 when the output of the delay circuit returns to H level. The pulse generated in this manner is generally referred to as "noise", and generation of such an internal clock pulse referred to as the noise may cause malfunction or error in data output of the semiconductor memory device.

The fourth embodiment provides a configuration of the delay circuit capable of preventing such a problem.

FIG. 12 is a block diagram representing a configuration of a delay circuit 420 in accordance with the fourth embodiment. Referring to FIG. 12, delay circuit 420 is characterized in that, in addition to delay circuit 200 capable of setting delay amounts hierarchically described with respect to the second embodiment, a switch timing control circuit 480 and a count data transmitting circuit 490.

FIG. 13 is a circuit diagram representing a configuration of switch timing control circuit 480.

Referring to FIG. 13, switch timing control circuit 480 includes a group of inverters (odd-numbered) 482 inverting and delaying a signal at node N1 and transmitting the result to node N3, a frequency dividing circuit 484 frequency-dividing clock signal BufCLKR by 2 to provide a signal BufCLKRdbl, and a logic gate LG20 receiving as 3 inputs the signals at nodes N1 and N3 and the frequency-divided signal BufCLKdbl and providing a result of NAND operation.

Logic gate LG20 outputs a timing control signal /TMF. Switch timing control circuit 480 further includes an inverter IV20 inverting timing control signal /TMF and outputting a timing control signal TMF, an inverter IV22 inverting an output of inverter IV20, and an inverter IV24 inverting an output of inverter IV22. Inverter IV22 outputs timing control signal /TMC, and inverter IV24 outputs timing control signal TMC. These timing control signals TMF, /TMF, TMC and /TMC are supplied to count data transmitting circuit 490.

Count data transmitting circuit 490 takes in the count data ADR<0:M−1> output from up/down count circuit 154 in accordance with a timing control signal transmitted from switch timing control circuit 480 and latches the signal as ADR'<0:M−1>. Delay circuit 220 operates in response to the signal ADR'<0:M−1>. Count data transmitting circuit 490 includes count data transmitting units 495-0 to 495-(M−1) provided corresponding to respective bits of the count data.

FIG. 14 is a timing chart related to the operation of switch timing control circuit 480.

Referring to FIG. 14, corresponding to the signal int.CLKR which is an input signal to delay circuit 220, the frequency-divided signal BufCLKRdbl is output. The signal level of node N1 is, as it is an output of inverter IV10 receiving clock signal BufCLKR, the signal obtain by inverting and delaying the clock signal BufCLKR. The signal level at node N3 is the signal obtained by further delaying and inverting the signal at node N1 by the group of inverters 482.

As the timing control signal TMF is an inverted signal of the output of logic gate LG20, it is a result of an AND operation having frequency-divided signal BufCLKRdbl and the signals at nodes N1 and N3 as 3 inputs. Therefore, by adjusting the number of stages of the group of inverters 482, it is possible to activate (H level) the timing control signal TMF only in that period in which the input signal BufCLKR to the delay circuit is at the L level. It is also possible to activate timing control signal TMC at a similar timing.

Here, the timing control signal TMF is for defining the timing at which the lower bit of the count signal corresponding to the sub delay unit is transmitted to the delay circuit, and timing control signal TMC is for defining the timing at which the higher bit of the count signal corresponding to the delay unit is transmitted to the delay circuit.

FIG. 15 is a circuit diagram representing a configuration of count data transmitting unit 495. FIG. 15 represents a configuration of a jth (j: integer from 0 to M−1) count data transmitting unit 495-j.

Referring to FIG. 15, count data transmitting unit 495-j includes a clocked inverter CINV10 controlled by a timing signal, an inverter IV40 inverting an output of clocked inverter CINV10, and an inverter IV42 arranged to form a latch circuit together with inverter IV40. Inverter IV42 is provided for latching data, and therefore, it may be designed to have smaller drivability than inverter IV40.

Clocked inverter CINV10 receives the j+lth bit of the count data, that is, ADR<j> at an input node. When j=0 to 2, clocked inverter CINV10 is controlled by the timing control signals TMF and /TMF, and when j=3 to M−1, controlled by timing control signals TMC and /TMC.

Because of this configuration, count data transmitting unit 495 transmits the count data ADR<j> in a period when the timing control signal TMF or TMC is at the H level. The period in which the timing control signals TMF and TMC are at the H level is limited to that period in which the input signal of the delay circuit is at the L level, as described with reference to FIG. 14. Therefore, the timing at which setting of delay time switches in the delay circuit can be set avoiding the period in which the clock signal BufCLKR is at the H level.

Therefore, it is possible to prevent the instantaneous drop of the output of the delay circuit from H to L level because of the switching of the delay control amount and to prevent generation of the corresponding noise like clock pulse, and therefore more stable operation of the semiconductor memory device is possible.

[Fifth Embodiment]

As already described, in a DLL circuit, it is a general practice to drive the delay circuit by an independent power supply voltage, so as to stabilize the amount of delay added by the delay circuit. Therefore, when a trigger signal to the buffer circuit is to be provided by using the output of the delay circuit, it is necessary that the output is passed through a level shift circuit for converting the voltage level. In the fifth embodiment, an arrangement of a level shift circuit which enables wide frequency range allowing locking in the DLL circuit will be described.

FIG. 16 is a block diagram representing a configuration of DLL circuit 500 in accordance with the fifth embodiment.

Referring to FIG. 16, DLL circuit 500 is different from DLL circuit 100 in accordance with the first embodiment in that a level shift/pulse generating circuit 510 is provided in place of level shifters 130, 135 and pulse generating circuit 160. Except this point, the configuration and operation are the same as those of DLL circuit 100 in accordance with the first embodiment. Therefore, description thereof is not repeated.

The DLL circuit 500 in accordance with the fifth embodiment is characterized in that the level shifter circuit for converting the voltage level of the output signal of delay circuit 120 is arranged outside the delay loop provided between clock input buffer 110 and phase comparing circuit 152. Therefore, the minimum value of the delay time added by the delay loop (hereinafter also referred to as the minimum delay time) becomes the sum of the minimum delay time (tdc) in the delay unit of delay circuit 120 and the delay time (To+Ti) of delay replica circuit 140.

As compared with the minimum delay time added by DLL circuit 100 in accordance with the first embodiment which is To+Ti+Trs (time required for voltage level conversion in level shifter 130)+tdc, the minimum delay time added by the delay loop can further be reduced in DLL circuit 500 in accordance with the fifth embodiment. The DLL circuit is incapable of locking at a frequency corresponding to a period shorter than the minimum delay time added by the delay loop, and therefore, reduction in the minimum delay time widens the frequency range allowing locking in the DLL circuit to the higher frequency side.

FIG. 17 is a circuit diagram representing a configuration of level shift/pulse generating circuit 510.

Referring to FIG. 17, level shift/pulse generating circuit 510 includes a level shift circuit 130 converting voltage level of the clock signal output from delay circuit 120 to node N5, a group of inverters (odd-numbered) 512 inverting and delaying the output of level shift circuit 130 and providing the result to node N7, a logic gate LG22 receiving as two inputs the signals at nodes N5 and N7 and providing a result of an NAND logic operation, and an inverter IV44 inverting the output of logic gate LG22 and outputting the result to a node N8.

The level shift/pulse generating circuit 510 further includes a level shift circuit 135 for converting voltage level of the output signal from delay circuit 125 output at node N6, a group of inverters (odd-numbered) 514 inverting and delaying the output of level shift circuit 135, a logic gate LG24 receiving as two inputs the outputs of node N6 and inverter group 514 and providing the result of an NAND logic operation, an inverter IV46 inverting the output of logic gate LG24 and outputting the result to a node N9, and a logic gate LG26 receiving as two inputs the signals at nodes N8 and N9 and outputting the result of an OR operation as an internal clock pulse int.CLKP.

FIG. 18 is a timing chart representing the operation of level shift/pulse generating circuit 510.

Referring to FIG. 18, a signal obtained by delaying clock signal int.BufCLKR by delay circuit 120 is output at node N5. The amplitude of the signal at node N5 is driving power supply voltage int.Vdd of the delay circuit. The signal at node N5 is converted to a signal having the amplitude of Vcc which is the driving power supply voltage of other circuitry by means of level shift circuit 130, and inverted and delayed by the inverter group 512. Therefore, the signal output at node N7 is the signal at node N5 inverted and delayed with the amplitude level converted to Vcc. At node N8, the result of an AND operation of the signals at nodes N5 and N7 is output. Therefore, at node N8, a one shot pulse having the amplitude of Vcc is generated corresponding to the rising edge of the output signal of delay circuit 120 output to node N5.

The signal obtained by adding the same delay time to the signal BufCLKF having inverted phase to BufCLKR as the input signal to delay circuit 120 is output to node N6, as an output of delay circuit 125. In other words, the signal output to node N6 is a signal having the same amplitude as and inverted phase to the signal output to node N5. Though not shown, a one shot pulse is generated corresponding to the rising edge of the signal transmitted to node N6, at node N9. Therefore, the internal clock pulse int.CLKP obtained as a result of an OR operation between nodes N8 and N9 results in a one shot pulse having the amplitude of Vcc, corresponding to the rising edge of each of the output signals from delay circuits 120 and 125.

By this configuration, even when the level shifter is removed from the delay loop by which the clock signal is fed back to the phase comparator so as to widen the frequency range allowing locking, it becomes possible to obtain an internal clock pulse of which voltage level is converted, in synchronization with both the rising and falling edges of the external clock signal, as in DLL circuit 100 in accordance with the first embodiment.

[Sixth Embodiment]

In the sixth embodiment, a configuration will be described which operates the semiconductor memory device more stably, by limiting to some extent the timing for switching the delay time in accordance with the variation of count data, in the DLL circuit allowing hierarchical setting of the delay time described with respect to the second embodiment.

Again referring to FIG. 8, in the DLL circuit in which delay times are set hierarchically, there is a timing when the delay time added by the activation of all sub delay units attain to the delay time (tdc) of one delay unit, in accordance with the increment of the control delay amount. At this time, when the difference between these two is large, a large jitter results, and the interval of generating internal clock pulses may differ. If such variation of the interval generates during data read, the valid period of the read data output to the data input/output terminal would vary, possibly resulting in malfunction in the reading operation.

The DLL circuit in accordance with the sixth embodiment includes, in the DLL circuit 100 in accordance with the first embodiment described with reference to FIG. 2, a phase difference control circuit 650 in place of phase difference control circuit 150. Except this point, the circuit configuration and the operation of the DLL circuit in accordance with the sixth embodiment are the same as those of DLL circuit 100 in accordance with the first embodiment described with reference to FIG. 2. Therefore, description thereof is not repeated.

FIG. 19 is a block diagram representing a configuration of phase difference control circuit 650.

Referring to FIG. 19, phase difference control circuit 650 is different from phase difference control circuit 150 in that it additionally includes a count operation stopping circuit 655 between phase comparing circuit 152 and up/down count circuit 154. Count operation stopping circuit 655 receives a count clock cntclk output from phase comparing circuit 152 and a count stopping signal CNTSTP, and outputs a count control clock cntclk2. Up/down count circuit 154 updates count data ADR<0:M−1> in accordance with the count designating signals DWN, UP and LCK output from phase comparing circuit 152 in synchronization with count control clock cntclk2.

Count stopping signal CNTSTP is activated (L level) for temporarily stopping count data updating operation by up/down count circuit 154, by stopping generation of the count control clock cntclk2.

For example, by the control circuit in the semiconductor memory device described with reference to FIG. 1, when one read operation starts, the count stopping signal CNTSTP is kept active (L level) until output of the read data is complete, so as to prevent variation or change in the count data before the end of the read cycle.

FIG. 20 is a timing chart representing the operation of phase difference control circuit 650.

Referring to FIG. 20, at a rising edge of external clock signal ext.CLK at time t0, a read cycle starts. The count stopping signal CNTSTP is activated (L level) at a time point t1 after an interval period tint from the time point t0 at which the read operation starts. The interval period tint is consumed for address decoding for selecting a memory cell as the object of the reading operation and selection of column select line.

From time point t1 to time point t2, until read data output from data input/output terminal is completed, considering burst length, the active state (L level) of the count stopping signal CNTSTP is maintained. In order to execute phase comparison of clock signal BufCLKR output in response to the rising edge of external clock signal ext.CLK, phase comparing circuit 152 generates a count clock cntclk for activating counting operation of up/down count circuit 154 at each rising edge of the external clock signal ext.CLK. Because of the function of count operation stopping circuit 655, however, activation of the count control clock cntclk2 is stopped in that period in which the count stopping signal CNTSTP is active.

Therefore, in this period, the count data ADR<0:M−1> is not updated in up/down count circuit 154, and in this period, the interval of generation of the internal clock pulse int.CLKP is kept constant. Therefore, the problem that valid time width of the read data varies because of variation in the interval of generation of the internal clock pulse in one reading operation can be eliminated, and the reading operation of the semiconductor memory device can be executed more stably.

Further, similarly, by using phase difference control circuit 650 in place of phase difference control circuit 150 of the conventional DLL circuit 1000, the sixth embodiment may be applied to a DLL circuit having a single delay line to attain similar effects.

[Seventh Embodiment]

As already described with reference to the third embodiment, in order to stabilize the delay time set by the delay circuit, stabilization of the driving power supply voltage for the delay circuit is of critical importance. In the seventh embodiment, a configuration will be described which more stably supplies the driving power supply voltage of the delay circuit.

FIG. 21 is a schematic illustration representing supply of the driving power supply voltage to a DLL circuit 700 in accordance with the seventh embodiment.

Referring to FIG. 21, the voltage generating circuit (VDC) 350 receives an external power supply voltage ext.Vdd from an external power supply terminal 580, and generates an internal power supply voltage int.Vdd for driving the delay circuit in DLL circuit 700. The internal power supply voltage int.Vdd is not directly supplied to DLL circuit 700 but through a decouple capacitance 570 provided between voltage generating circuit 350 and DLL circuit 700. By this configuration, a lowpass filter is formed between the voltage generating circuit 350 and the DLL circuit.

FIG. 22 is a block diagram representing a configuration of a lowpass filter 710 formed at an input stage of DLL circuit 700 in accordance with the seventh embodiment.

Referring to FIG. 22, voltage generating circuit 350 includes a voltage comparing circuit 352 comparing voltage level int.Vdd of power supply line 355 and the target voltage Vref for int.Vdd, and a drive transistor 354 which is turned on to supply current when int.Vdd <Vref under the control of voltage comparing circuit 352.

Between voltage generating circuit 350 and DLL circuit 700, a lowpass filter 710 is formed. The lowpass filter 710 includes a resistance component which is a sum of the line resistance value Rw of power supply line 355 and an on resistance Rd of drive transistors 354, and a decouple capacitance (capacitor value Cd) provided between power supply line 355 and the ground line 590.

By the function of lowpass filter 710, a configuration is implemented in which the voltage variation of high frequency component generated on power supply line 355 is not directly supplied to DLL circuit 700. Therefore, it becomes possible to reduce fluctuation of the internal power supply voltage supplied to DLL circuit 700 and to effectively prevent generation of noise and the like in the DLL circuit.

The configuration in accordance with the seventh embodiment attains the above described effects when applied to any of the configurations in accordance with the first to sixth embodiments or in the configuration of the conventional DLL circuit 1000.

[Eighth Embodiment]

In the eighth embodiment, a configuration will be described which allows setting of delay time of delay replica circuit provided in the DLL circuit for attaining phase synchronization considering the delay time consumed by the buffer circuits at signal input/output even after chip molding.

As already described, delay replica circuit 140 includes output buffer replica circuit 142 for adding delay time To generated in output buffer 60 in the delay loop, and input buffer replica circuit 144 for adding, as a dummy, the delay time Ti generated in the clock input buffer. As the function and configuration of these replica circuits are the same, the replica circuits will be generally referred to as a delay replica circuit 140 in the eighth embodiment.

FIG. 23 is a circuit diagram representing a general configuration of delay replica circuit 140.

Referring to FIG. 23, delay replica circuit 140 includes a plurality of (even-numbered) inverters connected in series. The number of stages of the inverters is adjusted so that the delay time added by these replica circuits matches To or Ti. In this configuration, however, the delay time can be adjusted simply by changing the number of inverters.

In the steps of manufacturing a semiconductor, tests are conducted in various stages. In a wafer test generally conducted in the wafer stage, the operation frequency for the test is relatively low as about 20 MHz, and therefore it is very difficult to actually measure the jitter in the DLL. By contrast, in the final test conducted after chip molding, in good test environment, it is possible to measure the jitters. Therefore, in the eighth embodiment, a circuit configuration allowing fine adjustment of the delay time added by the replica circuit at the time of final testing after chip mold will be described.

In the eighth embodiment, the delay amount of the replica circuit is programmed by using an antifuse circuit. FIGS. 24A to 24D are circuit diagrams representing configuration and operation of the antifuse circuit.

Figures 24A, 24B, 24C, 24D:
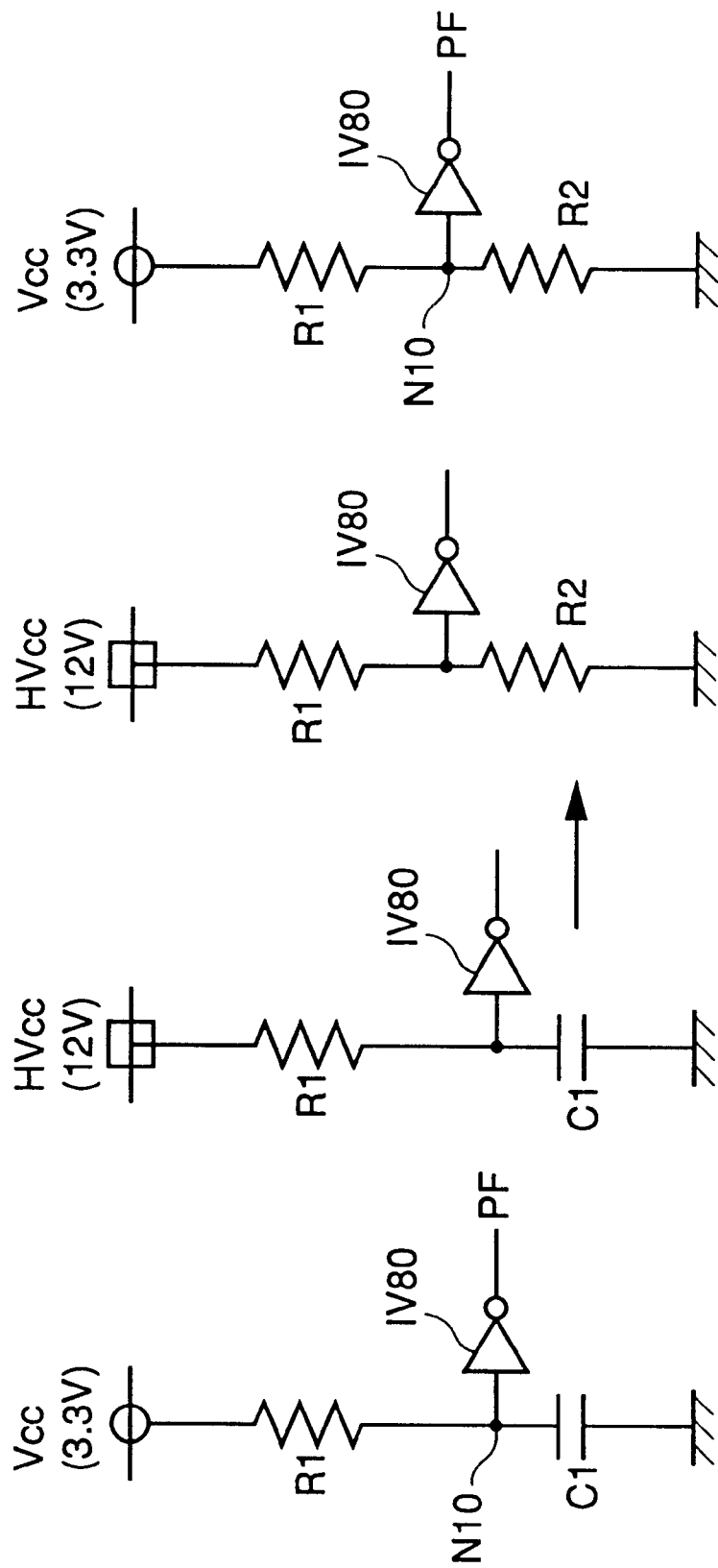

FIG. 24A is a circuit diagram representing the configuration of the antifuse circuit. The antifuse circuit has a resistance element R1 coupled between an operational power supply Vcc (for example, 3.3V) and a node N10, a capacitor C1 connected between node N10 and the ground line, and an inverter IV80 having an input node connected to node N10. Inverter IV80 outputs a program value PF. In this state, the voltage level of node N10 is at Vcc, and therefore PF="0" (L level). Capacitor C1 may be formed by an electrode capacitor of the memory cell, or by a gate oxide film of MOS transistor.

Referring to FIG. 24B, an operation at the time of programming will be described. At the time of programming, a high voltage HVcc (for example, 12V) is externally applied to node N10 of the antifuse circuit.

Accordingly, as can be seen from FIG. 24C, insulating film of capacitor C1 is broken and capacitor C1 is turned to a resistance element (resistance value R2).

In the normal operation after programming, the voltage level at node N10 is $V10=R2/(R1+R2)\cdot Vcc$ as shown in FIG. 24D. Therefore, by determining the ratio of resistance elements R1 and R2 such that the value V10 at this time is lower than the threshold voltage of inverter IV80, it becomes possible to change the program value PF from "0 (L level)" to "1 (H level)" by external programming.

FIG. 25 is a block diagram representing a configuration of a delay replica circuit 840 in the DLL circuit 800 in accordance with the eighth embodiment.

Referring to FIG. 25, DLL circuit 800 in accordance with the eighth embodiment includes antifuse circuits 802-0 to 802-2. Antifuse circuits 802-0 to 802-2 output program values PF<0> to PF<2> and inverted signals /PF<0> to /PF<2>, respectively. Each of the antifuse circuits 802-0 to 802-2 has such a configuration that can receive the high voltage HVcc from external high voltage driver 804, through an address input terminal of the semiconductor memory device in which DLL circuit 800 is provided.

A block 806 in DLL circuit 800 generally represents a circuitry such as the clock input buffer and the delay circuit provided between the clock input terminal and the delay replica circuit 840. The output of delay replica circuit 840 is output to phase difference control circuit 150, and phase difference control circuit 150 generates and transmits to a delay circuit in circuit group 806, the count data in accordance with the result of phase comparison. Thus, a DLL loop is formed.

Replica circuit 840 in accordance with the eighth embodiment includes an inverter IV82 inverting an output of circuit group 806 and outputting the result to node N20, an inverter IV84 inverting the voltage level of node N20 and outputting the result to phase difference control circuit 150, and replica units 808-0 to 808-2 provided corresponding to antifuse circuits 802-0 to 802-2, respectively. Replica unit 808-0 has a transfer gate TG and a capacitor C connected in series between node N20 and the ground line. Transfer gate TG turns on/off in response to program values PF<0> and /PF<0>. When the program value PF<0> makes a transition from L ("0") to H ("1") level as a high voltage is applied to the corresponding antifuse 802-0, the capacitor C is added to the output node of inverter IV82 in response to conduction of the transfer gate, and hence the delay time is added.

Replica units 808-1 and 808-2 also have the similar configuration as replica unit 808-0, each having a transfer gate TG and a capacitor C connected between node N20 and the ground line. The transfer gates included in the replica units 808-1 and 808-2 are rendered conductive in response to the corresponding program values PF<1> and PF<2>, respectively.

By this configuration in which each replica unit has a capacitor having the capacitor value of C, it is possible to change the capacitor capacitance value connected to the output node of inverter IV82 in three different steps of C to 3C, by three bits of the program value PF<0> to PF<2>.

When the capacitor of replica unit 808-0 is adapted to have the capacitance value of C and the capacitors of replica units 808-1 and 808-2 are adapted to have the capacitance values of 2C and 4C, respectively, the capacitor capacitance value connected to the output node of inverter IV82 can be adjusted in seven different stages of C to 7C, by three bits of program value PF<0> to PF<2>.

In this manner, the DLL circuit 800 in accordance with the eighth embodiment allows stepwise adjustment and setting of the delay time added by delay replica circuit 840, by changing the value of each bit of the program value, by externally applying a high voltage HVcc after chip molding.

[First Modification of the Eighth Embodiment]

FIG. 26 is a block diagram representing a configuration of a delay replica circuit 841 in a DLL circuit 810 in accordance with the first modification of the eighth embodiment.

Referring to FIG. 26, in DLL circuit 810 in accordance with the first modification of the eighth embodiment, delay replica circuit 841 is provided in place of delay replica circuit 840. Except this point, the configuration and the operation are the same as those of DLL circuit 800 described with reference to FIG. 25. Therefore, description thereof is not repeated.

Delay replica circuit 841 has an even-numbered delay time variable inverters 850 connected in series. Each of the delay time variable inverters 850 has its delay time changed in response to the program values PF<0> to PF<2> output from antifuse circuits 802-0 to 802-2.

FIG. 27 is a circuit diagram representing a configuration of delay time variable inverter 850.

Referring to FIG. 27, delay time variable inverter 850 includes, in addition to a P type MOS transistor QP85 and an N type MOS transistor QN85, P type MOS transistors QP80, QP81 and QP82 coupled in parallel with each other between the power supply voltage Vcc and transistor QP85, and three N type MOS transistors QN80, QN81 and QN82 coupled in parallel with each other between the ground voltage Vss and transistor QN85.

The transistor QP80 has the channel width W, and receives at its gate the program value /PF<0>. Transistor QP81 has the channel width of 2W, and receives at its gate the program value /PF<1>. Transistor QP82 has the channel width of 4W and receives at its gate the program value /PF<2>.

Similarly, transistor QN80 has the channel width of W and receives at its gate the program value PF<0>. Transistor QN81 has the channel width of 2W, and receives at its gate the program value PF<1>. Transistor QN82 has the channel width of 4W and receives at its gate the program value PF<2>.

By this configuration, it becomes possible to adjust the channel widths of the P type transistors coupled between the power supply voltage Vcc and transistor QP85 and N channel transistors coupled between the ground line and transistor QN85 in seven different steps of W to 7W, in accordance with the program value of three bits.

As the channel width is adjusted in this manner, current drivability from the power supply voltage or the ground voltage to transistors QP85 and QN85 constituting the inverter can be changed, and therefore, the delay time added by inverter 850 can be changed.

When delay replica circuit 841 is formed by such a delay time variable inverter 850, it becomes possible to finely adjust the delay time added by delay replica circuit 841, by externally applying a high voltage and changing the program values PF<0> to PF<2> after chip molding.

[Second Modification of the Eighth Embodiment]

FIG. 28 is a block diagram representing a configuration of a delay replica circuit 842 in a DLL circuit 820 in the second modification of the eighth embodiment.

DLL circuit 820 in accordance with the modification of the eighth embodiment is different from DLL circuit 800 in accordance with the eighth embodiment in that it has delay replica circuit 842 in place of delay replica circuit 840. Except this point, the configuration is the same as that of DLL circuit 800, and therefore, description thereof will not be repeated.

Delay replica circuit 842 has delay units 200-0 to 200-2, coupled in series. The configuration of delay units 200-0 to 200-2 is as described with reference to FIG. 3. These delay units operate in response to the corresponding program values PF<0> to PF<2>. By this configuration, it becomes possible to adjust the delay time added by delay replica circuit 842 in three different stages, by the program values PF<0> to PF<2> of three bits.

In this manner, the delay amount added by the delay replica circuit is made programmable after chip molding utilizing an antifuse, so that tuning reflecting subtle difference of input/output timings resulting from difference in impedance or the like derived from difference in cycle time standard tC or the form of molding among chips is possible.

Delay replica circuits 840 to 842 described in the eighth embodiment are applicable to any of the configurations in accordance with the first to seventh embodiments as well as to the configuration of conventional DLL circuit 1000 to attain the above described effects.

[Ninth Embodiment]

The ninth embodiment provides a configuration of a delay unit the delay time added by which has small dependency on temperature.

As already described with reference to FIG. 3, for example, a delay unit 200 is used as a unit circuit for adding the delay amount in the DLL circuit. Delay unit 200 has an inverter and a clocked inverter and some of delay times added by the inverter and the clocked inverter corresponds to the delay time of the delay unit.

The delay time added by the common inverter and the clocked inverter has temperature dependency and becomes shorter at a lower temperature. Therefore, in order to generate an internal clock synchronized with an external clock signal having low frequency at a low temperature range, it is necessary to provide a large number of delay units. In order to satisfy the rated value of operation specification at a low temperature, low frequency side, the large number of delay units have been necessary, resulting in increased layout area. The ninth embodiment provides a configuration of the inverter and the clocked inverter constituting the delay unit of which delay time has small temperature dependency.

FIG. 29 is a circuit diagram representing a configuration of inverter IV90 included in the delay unit in accordance with the ninth embodiment.

Referring to FIG. 29, inverter IV90 includes, in addition to a P type MOS transistor QP90 and an N type MOS transistor QN90 constituting a common inverter, a resistor R90 connected between transistor QP90 and an output node, and a resistor R91 connected between transistor QN90 and the output node.

Generally, channel resistance of an MOS transistor has temperature dependency and the resistance value becomes smaller at a lower temperature range. Therefore, the propagation delay time of a common inverter is shorter in a lower temperature range and longer in a higher temperature range.

The temperature dependency of a resistor is lower than the temperature dependency of the channel resistance value of the MOS transistor. Therefore, the temperature dependency of the total propagation delay time of inverter IV90 in accordance with the ninth embodiment in which the delay is added by the resistors in addition to the configuration of the common inverter is lower than that of the inverter having conventional configuration. The resistors may be formed by diffusion resistance or polysilicon resistance.

FIG. 30 is a circuit diagram representing a configuration of a clocked inverter CIV90 in accordance with the ninth embodiment.

Referring to FIG. 30, clocked inverter CIV90 includes, in addition to P type MOS transistors QP91 and QP92 and N type MOS transistors QN91 and QN92 constituting a common clocked inverter, a resistance element R92 connected between transistor QP92 and an output node and a resistance element R93 connected between transistor QN92 and the output node.

By this configuration, as in the case of inverter IV90 described with reference to FIG. 29, temperature dependency of the delay time generated in clocked inverter CIV90 can be made lower than that of the common clocked inverter.

When a delay unit is formed by using such inverter IV90 and clocked inverter CIV90, temperature dependency of the delay time tdc added in each delay unit can be made lower than the delay unit constituted by the common inverter and clocked inverter. Therefore, as long as the driving voltage is maintained at a constant level, significant decrease in tdc can be avoided even at a low temperature range.

Therefore, when the DLL circuit is formed by using the delay units each having the configuration including inverter IV90 and clocked inverter CIV90 described in the ninth embodiment, the maximum number of stages of the delay units necessary for ensuring the operation specification at a lower temperature range can be reduced, and hence layout area can be reduced.

The configuration of the delay unit described in the ninth embodiment is applicable to the DLL circuits in accordance with the first to eighth embodiments as well as to the DLL circuit 1000 of the prior art to attain the similar effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generating circuit generating an internal clock signal synchronized with an external clock signal, comprising:

a first input buffer circuit generating a first internal signal according to voltage levels of said external clock signal and an inverted external clock signal;

a first delay circuit adding a delay control time to said first internal signal;

a phase difference control circuit setting said delay control time in accordance with phase difference between said first internal signal and an output signal of said first delay circuit;

a second input buffer circuit generating a second internal signal having phase inverted from that of said first internal signal, according to voltage levels of said external clock signal and said inverted external clock signal;

a second delay circuit adding said delay control time set commonly to said first delay circuit, to said second internal signal under control of said phase difference control circuit; and a signal generating circuit generating said internal clock signal in response to output signals of said first and second delay circuits.

2. The clock generating circuit according to claim 1, wherein said phase difference control circuit generates a count data signal of M bits (M: natural number) counted in accordance with said phase difference for setting said delay control time;

each of said first and second delay circuits includes a plurality of delay unit circuits connected in series, each adding a first delay time, and J (J: natural number smaller than M) sub delay unit circuits provided for adding a second delay time shorter than said first delay time; and delay time is added to said first and second internal signals by at least one of said delay unit circuits whose number corresponds to higher (M–J) bits of said count data signal among said plurality of delay unit circuits and each of said J sub delay unit circuits selectively activated/inactivated in response to lower J bits of said count data signal.

3. The clock generating circuit according to claim 2, wherein each of said first and second delay circuits further includes an internal node transmitting corresponding one of said first and second internal signals;

first one of said sub delay unit circuits has a transfer gate turned on/off in response to the least significant bit of said count data signal and a capacitor having a capacitance value C, coupled in series between said internal node and a voltage node; and Kth (K: natural number not smaller than 2 and not larger than J) one of said sub delay unit circuits has a transfer gate turning on/off in response to the Kth bit from the least significant bit of said count data signal and a capacitor having a capacitance value $2^{(K-1)}\cdot C$, coupled in series between said internal node and said voltage node.

4. The clock generating circuit according to claim 2, wherein each of said delay unit circuits includes a plurality of inverters connected in series, at least one of said plurality of inverters having a first MOS transistor and a first resistance element coupled in series between a first voltage and an output node of corresponding one of said inverters, and a second MOS transistor and a second resistance element coupled in series between a second voltage and said output node, said first and second MOS transistors having their gates electrically coupled to an input node of corresponding one of said inverters.

5. The clock generating circuit according to claim 2, wherein each of said first and second delay circuits further includes a timing control circuit designating transmission of the count data signal for a prescribed time period while corresponding one of said first and second internal signals is inactive, and a count data transmitting circuit taking and latching said count data signal in said prescribed time period designated by said timing control circuit; and said delay unit circuits and said sub delay unit circuits operate based on the count data signal latched by said count data transmitting circuit.

6. The clock generating circuit according to claim 1, wherein said first and second delay circuits each include a plurality of delay unit circuits connected in series with each other;

said first and second internal signals pass through L, from the first to Lth (L: natural number), of said plurality of delay unit circuits, in said first and second delay circuits respectively, in accordance with said delay control time; and said plurality of delay unit circuits of said first delay circuit are arranged so that driving voltage of the first to Lth delay unit circuits is at the same level as driving voltage of the first to Lth delay unit circuits of said second delay circuit, respectively.

7. The clock generating circuit according to claim 1, wherein said signal generating circuit includes a first level converting circuit arranged outside a delay loop provided between said first input buffer circuit and said phase difference control circuit, and for converting amplitude of an output signal of said first delay circuit, a second level converting circuit for converting amplitude of an output signal of said second delay circuit, and a signal generation sub circuit generating said internal clock signal in response to output signals of said first and second level converting circuits.

8. The clock generating circuit according to claim 1, further comprising:

a voltage generating circuit receiving an external power supply voltage and generating an internal power supply voltage for driving said clock generating circuit;

a power supply line supplying said internal power supply voltage to said clock generating circuit; and a stabilizing capacitance connected to said power supply line.

9. A clock generating circuit generating an internal clock signal synchronized with an external clock signal, comprising:

a first input buffer circuit generating a first internal signal in response to said external clock signal;

a first delay circuit adding a delay control time to said first internal signal;

a phase difference control circuit setting said delay control time in accordance with phase difference between said first internal signal and an output signal of said first delay circuit;

a second input buffer circuit generating a second internal signal having phase inverted from that of said first internal signal, in response to said external clock signal;

a second delay circuit adding said delay control time set commonly to said first delay circuit, to said second internal signal under control of said phase difference control circuit; and a signal generating circuit generating said internal clock signal in response to output signals of said first and second delay circuits, wherein said first and second delay circuits each include a plurality of delay units circuits connected in series with each other;

said first and second internal signals pass through L, from the first to Lth (L: natural number), of said plurality of delay unit circuits, in said first and second delay circuits respectively, in accordance with said delay control time; and said plurality of delay unit circuits of said first delay circuits are arranged so that driving voltage of the first to Lth delay unit circuits is at the same level as driving voltage of the first Lth delay unit circuits of said second delay circuit, respectively;

said clock generating circuit further comprising:

first and second power supply lines for supplying the driving voltage from a voltage generating circuit to said first and second delay circuits respectively; wherein said plurality of delay unit circuits in said first delay circuit are supplied with said driving voltage by said first power supply line;

said plurality of delay unit circuits in said second delay circuit are arranged parallel to said delay unit circuits of said first delay circuit respectively, and supplied with said driving voltage by said second power supply line; and said plurality of delay unit circuits are arranged such that path length between said Lth delay unit circuit and said voltage generating circuit in said first delay circuit on said first power supply line is comparable to path length between said Lth delay unit circuit for the second delay circuit and said voltage generating circuit on said second power supply line.

10. The clock generating circuit according to claim 9, wherein said plurality of delay unit circuits are arranged such that path length on said first and second power supply lines between said voltage generating circuit and the Lth delay unit circuit is longer than that between said voltage generating circuit and (L−1)th delay unit circuit.

11. A clock generating circuit generating an internal clock signal synchronized with an external clock signal, comprising:

a first input buffer circuit generating a first internal signal in response to said external clock signal;

a first delay circuit adding a delay control time to said first internal signal;

a phase difference control circuit setting said delay control time in accordance with phase difference between said first internal signal and an output signal of said first delay circuit;

a second input buffer circuit generating a second internal signal having phase inverted from that of said first internal signal, in response to said external clock signal;

a second delay circuit adding said delay control time set commonly to said first delay circuit, to said second internal signal under control of said phase difference control circuit; and a signal generating circuit generating said internal clock signal in response to output signals of said first and second delay circuits, wherein said first and second delay circuits each include a plurality of delay units circuits connected in series with each other;

said first and second internal signals pass through L, from the first to Lth (L: natural number), of said plurality of delay unit circuits, in said first and second delay circuits respectively, in accordance with said delay control time; and said plurality of delay unit circuits of said first delay circuits are arranged so that driving voltage of the first to Lth delay unit circuits is at the same level as driving voltage of the first Lth delay unit circuits of said second delay circuit, respectively;

said clock generating circuit further comprising a power supply line for generating the driving voltage from a voltage generating circuit to said first and second delay circuit; wherein said Lth delay unit circuit of said first delay circuit and said Lth delay unit circuit of said second delay circuit are arranged adjacent to each other and supplied with said driving voltage from said power supply line.

12. The clock generating circuit according to claim 11, wherein said plurality of delay unit circuits are arranged such that path length on said power supply line between said voltage generating circuit and the Lth delay unit circuit is longer than that between said voltage generating circuit and (L−1)th delay unit circuit.

13. A semiconductor memory device operating in synchronization with an external clock signal, comprising:

a memory cell array having a plurality of memory cells;

a control circuit controlling a data access operation to said memory cells;

an output buffer circuit for outputting read data from said memory cell array; and a clock generating circuit generating an internal clock signal synchronized with said external clock signal, serving as a trigger signal for a data output operation in said output buffer circuit, said clock generating circuit including an input buffer circuit generating an internal signal in response to said external clock signal, a delay circuit adding a delay control time to said internal signal, a signal generating circuit generating said internal clock signal in response to an output signal of said delay circuit, and a phase difference control circuit setting said delay control time in accordance with phase difference between said internal signal and an output signal of said delay circuit, said phase difference control circuit having a phase difference comparing circuit comparing the phase difference, a phase difference count circuit operating in response to an output of said phase difference comparing circuit and changing setting of said delay control time, and a count stopping circuit for stopping operation of said phase difference count circuit so as to fix the setting of said delay control time in a period when the read data is output from said semiconductor memory device in said data access operation.

14. The semiconductor memory device according to claim 13, wherein said control circuit generates a count stopping signal activated in the period;

said phase difference comparing circuit generates a count clock signal which is an operation clock of said phase difference count circuit; and said count stopping circuit is provided between said phase difference comparing circuit and said phase difference count circuit and stops supply of said count clock signal to said phase difference count circuit when said count stopping signal is active.

15. A semiconductor memory device operating in synchronization with an external clock signal, comprising:

a memory cell array having a plurality of memory cells;

an output buffer circuit for outputting read data from said memory cell array; and a clock generating circuit generating an internal clock signal synchronized with said external clock signal, serving as a trigger signal for a data output operation in said output buffer circuit, said clock generating circuit including an input buffer circuit generating an internal signal in response to said external clock signal, a delay circuit adding a delay control time to said internal signal, a delay replica circuit adding a dummy delay time corresponding to delay times generated in said output buffer circuit and said input buffer circuit to an output signal of said delay circuit, a program circuit for setting, in non-volatile manner, said dummy delay time by an external electrical input, a phase difference control circuit setting said delay control time in accordance with phase difference between said internal signal and an output signal from said delay replica circuit, and a signal generating circuit generating said internal clock signal in response to the output signal of said delay circuit.

16. The semiconductor memory device according to claim 15, wherein said program circuit generates a program signal of N bits (N: natural number) set in non-volatile manner by the external electrical input;

said delay replica circuit includes even-numbered delay time control inverters connected in series between said delay circuit and said phase difference control circuit, each of said delay time control inverters having first and second MOS transistors having their gates coupled to an input node and drains coupled to an output node, N third MOS transistors coupled in parallel with each other between said first MOS transistor and a first voltage, turning on/off in response to N bits of said program signal, and N fourth MOS transistors coupled in parallel with each other between said second MOS transistor and a second voltage, turning on/off in response to N bits of said program signal.

17. The semiconductor memory device according to claim 16, wherein the first ones of said third and fourth MOS transistors each have a channel width of W, and the Ith (I: natural number not smaller than 2 and not larger than N) ones of said third and fourth MOS transistors each have a channel width of $2^{(I-1)} \cdot W$.

18. The semiconductor memory device according to claim 15, wherein said delay replica circuit includes N (N: natural number) replica unit circuits provided corresponding to respective bits of a program signal generated by said program circuit, each of said replica unit circuits having a capacitor and a transfer gate turning on/off in response to the corresponding bit of said program signal, coupled in series between an internal node coupled between said delay circuit and said phase difference control circuit and a voltage node.

19. The semiconductor memory device according to claim 18, wherein said transfer gate in the first one of said replica unit circuits turns on/off in response to the first bit of said program signal and said capacitor in said first one has a capacitance value C, and said transfer gate in the Kth (K: natural number not smaller than two and not larger than N) one of said replica unit circuits turns on/off in response to the Kth bit of said program signal and said capacitor in said Kth one has a capacitance value $2^{(K-1)} \cdot C$.

20. A clock generating circuit generating an internal clock signal synchronized with an external clock signal comprising:

an input buffer generating an internal signal in response to said external clock signal;

a delay circuit adding a delay control time to said internal signal and including a plurality of delay unit circuits connected in series, said delay unit circuits each including a plurality of inverters connected in series, at least one of said plurality of inverters having a first MOS transistor and a first resistance element coupled in series between a first voltage and an output node of the corresponding one of inverters, and a second MOS transistor and a second resistance element coupled in series between a second voltage and said output node, said first and second MOS transistors having their gates connected to an input node of the corresponding one of said inverters;

a phase difference control circuit setting said delay control time by setting the number of delay unit circuits to be activated in accordance with phase difference between said internal signal and an output signal of said delay circuit; and a signal generating circuit generating said internal clock signal in response to the output signal of said delay circuit.

* * * * *